United States Patent
Bang et al.

(10) Patent No.: US 12,044,705 B2
(45) Date of Patent: Jul. 23, 2024

(54) DEVICE FOR MEASURING CURRENT OF THREE-PHASE INVERTER AND METHOD THEREFOR

(71) Applicant: LG INNOTEK CO., LTD., Seoul (KR)

(72) Inventors: Ji Won Bang, Seoul (KR); Yang Hak Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 228 days.

(21) Appl. No.: 17/756,876

(22) PCT Filed: Nov. 25, 2020

(86) PCT No.: PCT/KR2020/016776
§ 371 (c)(1),
(2) Date: Jun. 3, 2022

(87) PCT Pub. No.: WO2021/112475
PCT Pub. Date: Jun. 10, 2021

(65) Prior Publication Data
US 2023/0003767 A1    Jan. 5, 2023

(30) Foreign Application Priority Data

Dec. 3, 2019  (KR) .................. 10-2019-0159170
Dec. 11, 2019 (KR) .................. 10-2019-0164901

(51) Int. Cl.
*G01R 15/14*   (2006.01)
*H02H 9/02*    (2006.01)

(52) U.S. Cl.
CPC ............ *G01R 15/146* (2013.01); *H02H 9/02* (2013.01)

(58) Field of Classification Search
CPC .................. G01R 1/203; G01R 15/146; G01R 19/0007
See application file for complete search history.

(56) References Cited

U.S. PATENT DOCUMENTS 7,193,388 B1 * 3/2007 Skinner ............ H02M 7/53873
                                                    318/807
2002/0167300 A1 * 11/2002 Kim .................. H02P 27/16
                                                    324/107

(Continued)

FOREIGN PATENT DOCUMENTS

JP    2006-42454 A     2/2006
KR    10-2016-0104774 A  9/2016

OTHER PUBLICATIONS

International Search Report dated Mar. 2, 2021 in International Application No. PCT/KR2020/016776.

*Primary Examiner* — Tung X Nguyen
(74) *Attorney, Agent, or Firm* — Saliwanchik, Lloyd & Eisenschenk

(57) ABSTRACT

A device for measuring a current of a three-phase inverter according to an embodiment of the present invention comprises: a current detection element connected to the lower end of one of three lower switches comprising an inverter; a current measurement unit for measuring a current by using the current detection element and the other two lower switches, to which the current detection element is not connected; and a current correction unit for correcting a second current value and a third current value measured using the two lower switches, on the basis of the relationship between a first current value measured using the current detection element and the second and third current values.

20 Claims, 28 Drawing Sheets

(56) References Cited

U.S. PATENT DOCUMENTS

| | | |
|---|---|---|
| 2009/0284194 A1 | 11/2009 | Forte |
| 2010/0019702 A1* | 1/2010 | Jang .................. G01R 19/0092 323/282 |
| 2012/0113701 A1 | 5/2012 | Wang et al. |
| 2014/0233278 A1 | 8/2014 | Li et al. |

* cited by examiner

FIG. 16

| Symbol | Unit | Name of Variable |
|---|---|---|
| X | Ampare | ECU current measurement value |
| B | Ampare | ECU current limit value |
| C | Ampare | Motor driving unit current measurement value |
| D | Ampare | Motor driving unit current limit value |
| E = (X−C) | Ampare | Control unit current calculated value |
| F | Ampare | Control unit current limit value |
| G | % | Motor unit output reduction ratio |
| H | No. of Times | Number of motor unit output reduction commands |
| I | No. of Times | Number of motor unit output reduction commands limit value |
| J | % | Control unit output reduction ratio |
| K | No. of Times | Number of control unit output reduction commands |
| L | No. of Times | Number of control unit output reduction commands limit value |
| M | sec | Task time |

FIG. 22

| Symbol | Unit | Name of Variable |
|---|---|---|
| X(C+E) | Ampare | ECU current measurement value |
| B | Ampare | ECU current limit value |
| C | Ampare | Motor driving unit current measurement value |
| D | Ampare | Motor driving unit current limit value |
| E | Ampare | DC Link current measurement value |
| F | Ampare | DC Link current limit value |
| G | % | Motor unit output reduction ratio |
| H | No. of Times | Number of motor unit output reduction commands |
| I | No. of Times | Number of motor unit output reduction commands limit value |
| J | % | DC Link output reduction ratio |
| K | No. of Times | Number of DC Link output reduction commands |
| L | No. of Times | Number of DC Link output reduction commands limit value |
| M | sec | Task time |

DEVICE FOR MEASURING CURRENT OF THREE-PHASE INVERTER AND METHOD THEREFOR

CROSS-REFERENCE TO RELATED APPLICATIONS

This application is the U.S. national stage application of International Patent Application No. PCT/KR2020/016776, filed Nov. 25, 2020, which claims the benefit under 35 U.S.C. § 119 of Korean Application Nos. 10-2019-0159170, filed Dec. 3, 2019; and 10-2019-0164901, filed Dec. 11, 2019; the disclosures of each of which are incorporated herein by reference in their entirety.

TECHNICAL FIELD

The present invention relates to a device for measuring current of 3-phase inverter, and more specifically, relates to: a device and method for measuring the current of a 3-phase inverter by using a current measurement in one shunt resistor and a switch; and an over current detection circuit and method for detecting and blocking over current of a control unit by adding a current detection element.

BACKGROUND ART

When measuring 3-phase current of 3-phase inverter, current is measured using a separate current sensor. Among them, the method using a single current sensor is widely used because of various advantages in terms of merits, for example, price or system size.

The 3-phase inverter system using such a single current sensor installs a single current sensor in a DC-link and measures the current from the single current sensor. In the inverter system using a single current sensor, a single current sensor is installed in the DC link, and the signal detected by the sensor is connected to the A/D converter to measure the U, V, and W phase currents. Here, in order to measure an accurate current value of two different phases, two switching states must be maintained for a predetermined time or longer. However, there is a case in which it is not possible to actually maintain a predetermined time, so there is a problem in that an area in which current measurement is not possible with a single current sensor occurs.

A vehicle provides the necessary power to an electronic control unit (ECU) or electronic control device inside the vehicle by using the power of a battery installed therein. The ECU can be used for a vehicle's electric power steering (EPS) actuator, and controls various devices including motors, and in particular, controls devices essential for safety. For safety, precision control is important, and to this end, a stable power must be provided to the ECU.

When an over current occurs due to battery power or a malfunction inside the ECU, the controller inside the ECU may be damaged, and problems may occur in the controller, the wiring inside the vehicle, and the upper level controller. Over current may be caused by a load exceeding the capacity of the controller, a failure due to a short circuit in the controller, or an inrush current. In the case of a current detection circuit that measures the motor current, there is a problem in that it cannot detect an abnormality even if an over current flows inside of the controller.

DETAILED DESCRIPTION OF THE INVENTION

Technical Subject

The technical problem to be solved by the present invention is to provide a device and a method for measuring the current of a 3-phase inverter by using a current measurement in one shunt resistor and a switch.

Another technical problem to be solved by the present invention is to provide an over current detection circuit and a method for detecting and blocking the over current in a control unit by adding a current detection element.

The problems of the present invention are not limited to the problems mentioned above, and other problems not mentioned will be clearly understood by those skilled in the art from the following description.

Technical Solution

A device for measuring a current of a three-phase inverter according to a first embodiment of the present invention comprises: a current detection element connected to a lower end of one of three lower switches comprising an inverter; a current measurement unit for measuring a current by using the current detection element and the other two of the lower switches, to which the current detection element is not connected; and a current correction unit for correcting a second current value and a third current value measured using the two lower switches, on the basis of the relationship between a first current value measured using the current detection element and the second current value and the third current value.

In addition, the current detection element may include a shunt resistor.

In addition, the current measurement unit may measure the first current value by detecting a voltage drop component of the shunt resistor.

In addition, the current measurement unit may measure the second current value and the third current value by detecting a voltage drop component of each of the two lower switches.

In addition, the lower switch may be comprised of an FET.

In addition, the current measurement unit may measure a second current value or a third current value by measuring a voltage drop generated by a resistance value between both ends of a drain and a source when the lower switch is turned on.

In addition, the current measurement unit may measure the second current value and the third current value by using each Rdson of the two lower switches.

In addition, the current correction unit determines whether the peak value of the second current value or the third current value is the same as the first current value, and when the peak value of the second current value or the third current value is different from the first current value, the scale of a second current value or a third current value having a different peak value from the first current value may adjusted.

In addition, it may further include a current control unit using the current value adjusted as above as a control signal of the inverter.

In order to solve the above technical problem, a device for measuring current of 3-phase inverter according to another embodiment of a first embodiment of the present invention comprises: three upper switches connected in parallel; three lower switches respectively connected to the three upper switches; a shunt resistor connected to one lower switch lower end of the three lower switches; a current measurement unit for measuring a first current value in the shunt resistor, and a second current value and a third current value in the two lower switches to which the shunt resistor is not connected; and a current correction unit for correcting the second current value or the third current value based on the first current value.

In order to solve the above technical problem, the current measuring method of the 3-phase inverter according to an embodiment of a first embodiment of the present invention comprises the steps of: measuring a first current value using a current detection element connected to a lower end of one of a lower switch of three lower switches comprising an inverter; measuring a second current value and a third current value using the other two lower switches to which the current detection element is not connected; and correcting the second current value and the third current value based on the relationship between the first current value, the second current value, and the third current value.

In addition, the current detection element may include a shunt resistor.

In addition, in a step of measuring of the first current value, a voltage drop component of the shunt resistor may be detected to measure the first current value.

In addition, in a step of measuring the second current value and the third current value, a voltage drop component of each of the two lower switches may be detected to measure the second current value and the third current value.

In addition, the step of correcting the second current value and the third current value may include the steps of: determining whether a peak value of the first current value and the second current value or the third current value is the same; and adjusting the scale of a second current value or a third current value which is different from the first current value and the peak value based on the first current value, when the peak value of the first current value and the second current value or the third current value is different from the first current value.

In addition, in a step of measuring the second current value and the third current value, a second current value or a third current value may be measured by measuring a voltage drop caused by the resistance value between both ends of a drain and a source when the lower switch is turned on.

In addition, in a step of measuring of the second current value and the third current value, the second current value and the third current value may be measured by using each Rdson of the two lower switches.

In addition, a step of using the current value corrected as above as a control signal of the inverter may be included.

In order to solve the other technical problem, the over current detection circuit according to an embodiment of a second embodiment of the present invention comprises: a first current measurement unit for measuring a current of a terminal back stage into which a DC link current, a control unit current, and a motor drive current are combined; a second current measurement unit for measuring a current of the motor driving unit; and a control unit detecting an over current flowing through the control unit by using a first current measured by the first current measurement unit and a second current measured by the second current measurement unit, and blocking the over current by reducing the output of a motor or reducing the output of a control unit.

In addition, when the first current is greater than a first threshold value and the second current is greater than a second threshold value, the motor output can be reduced by controlling the motor driving unit until the second current is less than or equal to the second threshold value.

In addition, the control unit may block the power being inputted to the ECU when the number of times of reducing the motor output is greater than or equal to a predetermined number of times or the second current does not become equal to or less than the second threshold value within a predetermined time.

In addition, when the first current is greater than a first threshold value and the second current is less than or equal to a second threshold value, the control unit may reduce the output of the control unit until a third current obtained by subtracting the second current from the first current becomes less than or equal to a third threshold value.

In addition, when the number of times of reducing the output of the control unit is greater than or equal to a predetermined number of times or when the third current does not become equal to or less than the third threshold value within a predetermined time, the control unit may block the power being inputted to the ECU.

In addition, the control unit may transfer an alarm to an upper level controller when detecting an over current flowing in the control unit.

In addition, the first current measurement unit or the second current measurement unit may include a shunt resistor.

In order to solve the other technical problem, an over current detection circuit according to another embodiment of a second embodiment of the present invention comprises: a third current measurement unit for measuring a DC link current; a fourth current measurement unit for measuring the current of a motor driving unit; and a control unit detecting an over current using a fourth current measured by the third current measurement unit and a fifth current measured by the fourth current measurement unit, and blocking the over current by reducing the output of a motor or reducing the output of a control unit.

In addition, when a sixth current that is the sum of the fourth current and the fifth current is greater than a fourth threshold value, and the fifth current is greater than a fifth threshold value, the control unit may reduce the motor output by controlling the motor driving unit until the fifth current is less than the fifth threshold value.

In addition, when the number of times of reducing the motor output is greater than or equal to a predetermined number of times or the fifth current does not become less than or equal to the fifth threshold value within a predetermined time, the control unit may block the power being inputted to the ECU.

In addition, when a sixth current that is the sum of the fourth current and the fifth current is greater than a fourth threshold value and the fifth current is less than or equal to a fifth threshold value, the control unit may reduce the output of the control unit until the fourth current becomes less than or equal to the sixth threshold value.

In addition, when the number of times of reducing the output of the control unit is greater than or equal to a predetermined number of times or the fourth current does not become less than or equal to the sixth threshold value within a predetermined time, the control unit may block the power being inputted to the ECU.

In order to solve the other technical problem, an over current detection method according to an embodiment of a second embodiment of the present invention comprises the steps of: measuring a first current flowing through a terminal back stage into which a DC link current, a control unit current, and a current of a motor driving unit are combined; measuring a second current flowing in the motor driving unit; detecting an over current flowing through a control unit using the first current and the second current; and reducing the motor output or reducing the control unit output to block the over current when the over current is detected.

In addition, in a step of blocking the over current, the motor output may be reduced by controlling the motor driving unit until the second current is equal to or less than the second threshold value when the first current is greater than a first threshold value and the second current is greater than a second threshold value.

In addition, when the number of times of reducing the motor output is greater than or equal to a predetermined number of times or the second current does not become less than or equal to the second threshold value within a predetermined time, a step of blocking power being inputted to the ECU may be included.

In addition, in a step of blocking the over current, the output of the control unit may be reduced until a third current obtained by subtracting the second current from the first current becomes less than or equal to a third threshold value when the first current is greater than a first threshold value and the second current is less than or equal to a second threshold value.

In addition, when the number of times of reducing the output of the control unit is greater than or equal to a predetermined number of times, or when the third current does not become less than or equal to the third threshold value within a predetermined time, a step of blocking power being inputted to the ECU may be included.

In addition, when detecting an over current flowing in the control unit, a step of transferring an alarm to an upper level controller may be included.

In order to solve the other technical problem, an over current detection method according to another embodiment of a second embodiment of the present invention comprises the steps of: measuring a fourth current flowing in the DC link; measuring a fifth current flowing through the motor driving unit; detecting an over current using the fourth current and the fifth current; and blocking the over current by reducing the motor output or reducing the output of the control unit when the over current is detected.

In addition, the step of blocking the over current may comprise the steps of: reducing the output of the control unit until the fourth current becomes less than or equal to the sixth threshold value by controlling a driving unit when a sixth current that is the sum of the fourth current and the fifth current is greater than a fourth threshold value and the fifth current is less than or equal to a fifth threshold value; blocking the power being inputted to the ECU when the number of times of reducing the motor output is greater than or equal to a predetermined number of times or when the fifth current does not become less than or equal to the fifth threshold value within a predetermined time; reducing the output of the control unit until the fourth current becomes less than or equal to a sixth threshold value when a sixth current that is the sum of the fourth current and the fifth current is greater than a fourth threshold value, and the fifth current is less than or equal to a fifth threshold value; and blocking the power being inputted to the ECU when the number of times of reducing the output of the control unit is greater than or equal to a predetermined number of times or when the fourth current does not become less than or equal to the sixth threshold value within a predetermined time.

Advantageous Effects

According to embodiments of the present invention, effects of three shunt resistance can be obtained by using one shunt resistor. In addition, it has strong characteristics against noise and torque ripple without an extra shunt control. Furthermore, preciseness in current detection can be increased, material cost can be reduced compared to the method using three shunt resistors, and circuit implementation is simple.

According to the embodiments of the present invention, it is possible to detect an over current flowing in the control unit and block it at an early stage. Through this, it is possible to inhibit failures in wiring inside the vehicle and other electric devices. In addition, it is possible to monitor the current flowing in the control unit at all times and to send an abnormality to an upper level controller.

The effect according to the present invention is not limited by the contents exemplified above, and more various effects are included in the present specification.

BRIEF DESCRIPTION OF DRAWINGS

FIGS. 14 to 16 are diagrams for explaining the operation of an over current detection circuit according to an embodiment of a second embodiment of the present invention.

FIGS. 21 and 22 are diagrams for explaining the operation of an over current detection circuit according to another embodiment of a second embodiment of the present invention.

BEST MODE

Hereinafter, preferred embodiments of the present invention will be described in detail with reference to the accompanying drawings.

However, the technical idea of the present invention is not limited to some embodiments to be described, but may be implemented in various forms, and within the scope of the technical idea of the present invention, one or more of the constituent elements may be selectively combined or substituted between embodiments.

In addition, the terms (including technical and scientific terms) used in the embodiments of the present invention, unless explicitly defined and described, can be interpreted as a meaning that can be generally understood by a person skilled in the art, and commonly used terms such as terms defined in the dictionary may be interpreted in consideration of the meaning of the context of the related technology.

In addition, terms used in the present specification are for describing embodiments and are not intended to limit the present invention.

In the present specification, the singular form may include the plural form unless specifically stated in the phrase, and when described as "at least one (or more than one) of A and B and C", it may include one or more of all combinations that can be combined with A, B, and C.

In addition, in describing the components of the embodiment of the present invention, terms such as first, second, A, B, (a), and (b) may be used. These terms are merely intended to distinguish the components from other components, and the terms do not limit the nature, order or sequence of the components.

And, when a component is described as being 'connected', 'coupled' or 'interconnected' to another component, the component is not only directly connected, coupled or interconnected to the other component, but may also include cases of being 'connected', 'coupled', or 'interconnected' due that another component between that other components.

In addition, when described as being formed or arranged in "on (above)" or "below (under)" of each component, "on (above)" or "below (under)" means that it includes not only the case where the two components are directly in contact with, but also the case where one or more other components are formed or arranged between the two components. In addition, when expressed as "on (above)" or "below (under)", the meaning of not only an upward direction but also a downward direction based on one component may be included.

Figure 1:
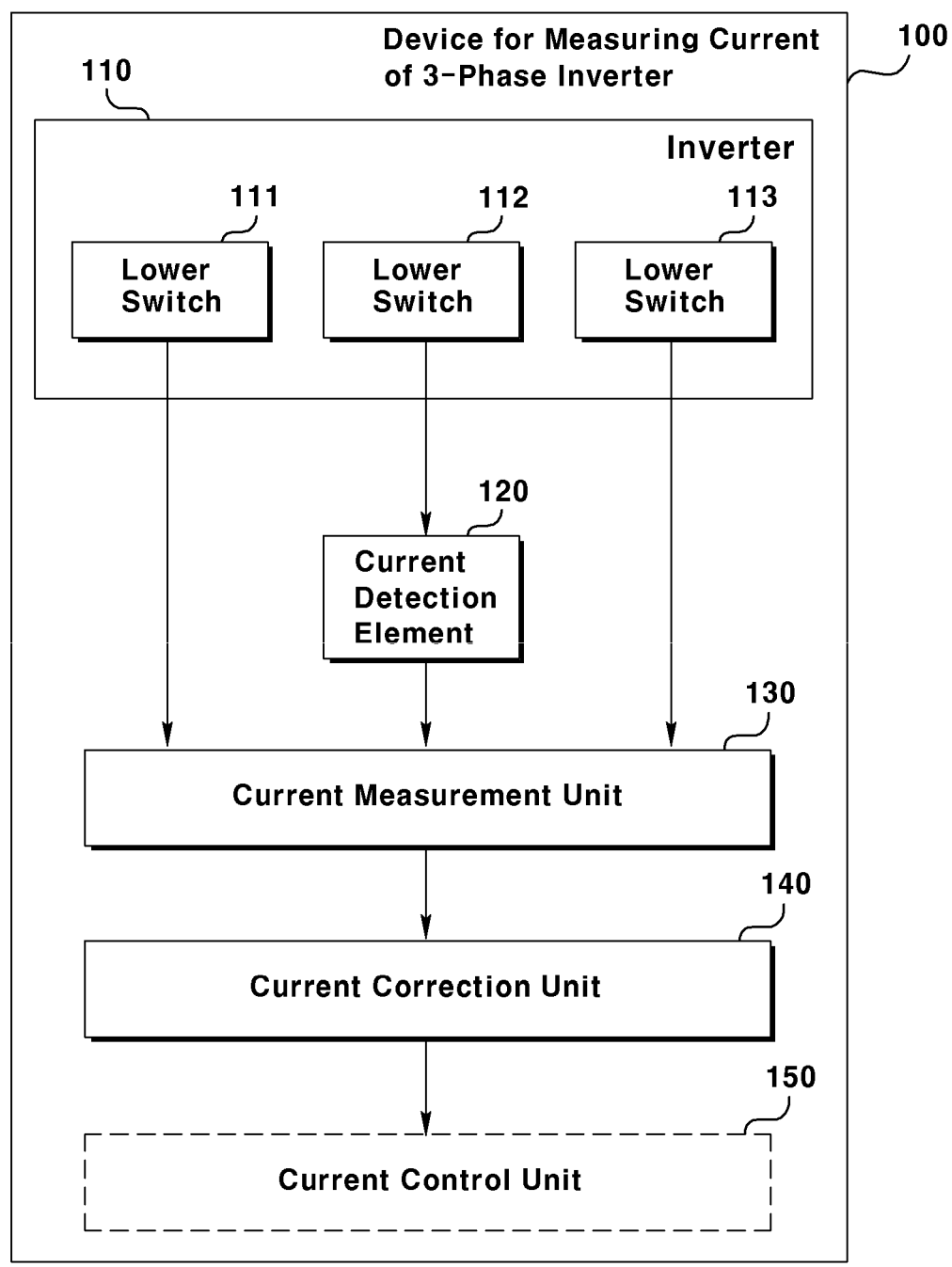
FIG. 1 is a block diagram of a device for measuring current of a 3-phase inverter according to an embodiment of a first embodiment of the present invention.

FIG. 1 is a block diagram of a device for measuring current of a 3-phase inverter according to an embodiment of a first embodiment of the present invention.

The device for measuring current of a 3-phase inverter 100 according to an embodiment of a first embodiment of the present invention may further include a current control unit 150 being comprised of a current detection element 120, a current measurement unit 130, and a current correction unit 140.

The current detection element 120 is connected to the lower end of one of the lower switches of the three lower switches comprising the inverter 110.

More specifically, to measure the three-phase current of the inverter, a current detection element 120 is connected to a lower end of one lower switch 112 among the three lower switches 111, 112, and 113 that form a 3-phase switch. By connecting the current detection element 120 to a lower end of one among the three lower switches 112 without connecting the current detection element to all of the three lower switches 111, 112, and 113, it can be used to measure the current of all three phases.

An inverter refers to a device that converts direct current (DC) into alternating current (AC). As in the case of operating a 3-phase motor using DC power, it serves to convert DC power into AC power to be suitable to a 3-phase power of the 3-phase motor. The inverter may be used for various purposes, such as a power inverter required for a motor, a motor control inverter, and an inverter for lighting.

The inverter may include: three upper switches connected in parallel to convert direct current to alternating current; three lower switches connected to each of the three upper switches; and three nodes connected to each of the upper switches and lower switches to apply power to a load such as a motor. The upper switches and the lower switches connected to each other form a half-bridge circuit, and are complementary connected to each other and can transfer power of three phases to a load.

The three lower switches 111, 112, and 113 forming the inverter 110 may be configured as FETs. FET is a field effect transistor, a semiconductor having three poles of a source, a drain, and a gate. A current between the source and the drain can be controlled by an electrostatic field generated by a voltage between the gate and the source. It can be used as a switching device by using these characteristics. The inverter 110 may use an FET as a lower switch.

In the case where the inverter 110 is an inverter for operating a motor and the like, currents in each of the three phases may be measured, and the motor may be controlled according to the measured currents. Current measurement in three phases is important for accurate motor control. For current measurement in three phases, the current detection element 120 is connected in series to a lower end of one of the three lower switches.

The current detection element 120 may include a shunt resistor. A shunt resistor is a resistor with a very low resistance value, and is also called a shunt. A shunt resistor is a resistor that divides the current and is used to measure the current. By connecting a shunt resistor in series to an element to measure the current, the voltage generated by the resistor can be measured to measure the current. In order to measure the current in this way, the shunt resistor may be connected in series to a lower end of one lower switch among the three lower switches of the inverter 110.

The current measurement unit 130 measures a current using the other two lower switches 111 and 113 to which the current detection element 120 is not connected and the current detection element 120.

More specifically, in order to measure a 3-phase current, the current measurement unit 130 measures the current in the other two lower switches 111 and 113 to which a current detection element 120 is not connected, and the current in the current detection element 120 is measured. The current measurement unit 130 measures a current in lower switches 111, 112, and 113 of the inverter 110 through which the 3-phase current flows, and for an accurate current measurement, a current is measured from the current detection element 120 connected to a lower end of one lower switch 112.

The current measurement unit 130 may measure the current by detecting a voltage drop component when measuring the current from the current detection element 120. When a shunt resistor is used as the current detection element 120, the current measurement unit 130 may measure the first current value by detecting a voltage drop component of the shunt resistor.

Voltage drop means that the voltage decreases when the voltage meets the resistance, and it is measured as the difference in voltage between the two terminals of the passive impedance. That is, the voltage drop may be detected by measuring the voltage difference between both ends of the current detection element 120, that is, the shunt resistor.

The current measurement unit 130 may measure the second current value and the third current value by detecting the voltage drop component of each of the two lower switches 111 and 113 to which the current detection element 120 is not connected. A second current value and a third current value can be measured by measuring the voltage drop at each of the lower switches 111 and 113 by measuring the voltage difference between both ends of each of the lower switches.

When the current measurement unit 130 measures the second current value and the third current value, when the lower switch is turned on, a second current value or a third current value may be measured by measuring the voltage drop caused by the resistance value across the drain and source. As previously described, in the inverter 110, one upper switch and one lower switch forming one half-bridge form a pair and are operated while complementarily conducting to each other, and in order to measure the current flowing through the lower switch, when the lower switch is turned on, current can be measured by measuring the voltage drop. A lower switch can be comprised of an FET, and when the lower switch is turned on, the current can be measured by measuring the voltage drop occurring in the resistance value between the drain and the source of the FET.

When measuring the second current value and the third current value, the current measurement unit 130 may measure the second current value and the third current value by using each Rdson of the two lower switches. When the lower switch is comprised of an FET, the power loss occurring in each lower switch can be expressed as Rds resistance in the equivalent circuit. That is, when the switch is turned on, the voltage at the drain and source terminals is Vds=I*Rds due to the resistance of Rds, and the voltage Vds is applied to both ends of the switch. The resistance value at this time is called Rdson, and the current flowing through the switch can be measured by using the Vds voltage. In an ideal switch, Rdson (resistance value between drain and source when the switch is turned on) is 0 when turned on, but a series resistance component exists in an actual switch. Therefore, the current can be measured by measuring the voltage drop caused by Rdson.

The current correction unit 140 corrects the second current value and the third current value based on the relationship between a first current value measured using the current detection element 120, a second current value measured using the two lower switches 111 and 113, and a third current value.

More specifically, although the first current value measured by the current detection element 120 is accurate, since the second current value and the third current value measured using the two lower switches 111 and 113 may not be accurate, the current correction unit 140 corrects the second current value and the third current value based on the relationship between the first current value, the second current value, and the third current value.

As described above, the lower switches 111, 112, and 113 are comprised of FETs, and since Rdson, which can be used to measure the voltage drop component in the lower switches, varies depending on the temperature or the size of the current, a precision current measurement may be difficult. That is, the current measurement unit 130 determines whether the current measured in the lower switches 111 and 113 is accurate through comparison with the current detected using the current detection element 120 with respect to the current measured in the lower switches 111 and 113 without the current detection element 120, and when determines that the current is not accurate, the corresponding current may be corrected to calculate an accurate current value.

In correcting the second current value and the third current value based on the relationship between the first current value, the second current value, and the third current value, the current correction unit 140 first determines whether the peak value of the first current value and the second current value or the third current value is the same, and when the peak value of the first current value and the second current value or the third current value is different, the scale of the second current value or the third current value having a different peak value from the first current value may be adjusted based on the first current value.

In converting direct current to alternating current in the inverter 110, current flows through each of the three phases, and each current actually flowing through the three phases must have the same peak value. Using this, it may be determined whether the second current value or the third current value is correct or whether correction is required. Specifically, it is determined whether the peak value of the first current value and the second current value or the third current value is the same. A peak value or a peak to peak value can be used. When the peak value of the second current value or the third current value is equal to the peak value of the first current value, the second current value or the third current value may be determined to be accurate. That is, it may be determined that the correction of the current value is not necessary.

However, when the peak value of the first current value and the second current value or the third current value is different, the second current value or the third current value different from the first current value or the third current value is not accurate, and it may be determined that correction is necessary. The second current value or the third current value determined to be corrected may be corrected by adjusting the scale of the current value.

The current control unit 150 uses the corrected current value as a control signal of the inverter.

More specifically, the current control unit 150 uses a current value of the three phases as a control signal of the inverter 110. The current control unit 150 may use the current value corrected in the current correction unit 140, for example, in order to control the time ratio of each switch included in the inverter 110 according to the current value flowing in the three phases.

Figure 2:
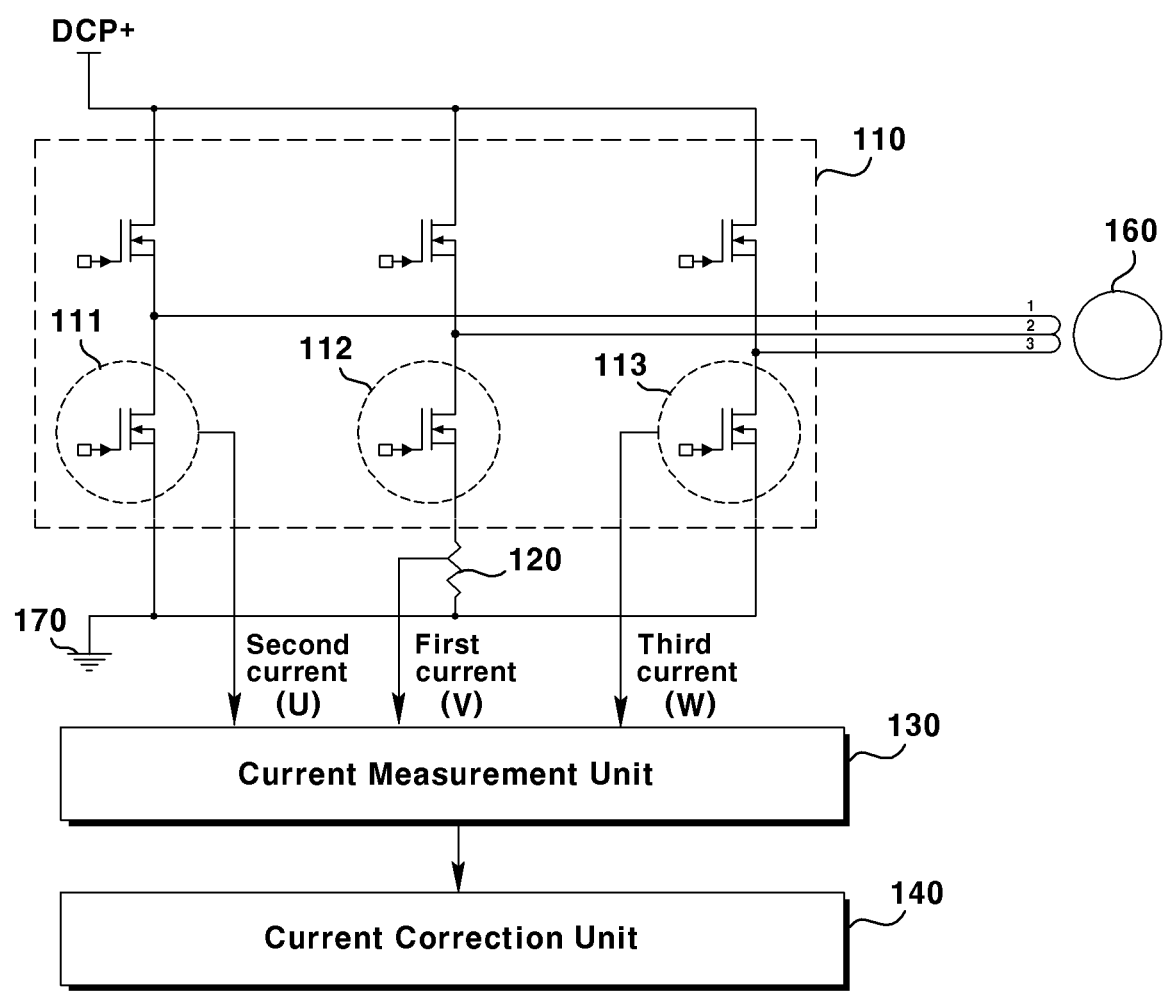
FIG. 2 illustrates an example in which the device for measuring current of a 3-phase inverter according to an embodiment of a first embodiment of the present invention is implemented on a 3-phase inverter circuit.

FIG. 2 illustrates an example in which the device for measuring current of a 3-phase inverter according to an embodiment of a first embodiment of the present invention is implemented on a 3-phase inverter circuit.

As shown in FIG. 2, the inverter 110 for converting DC to AC to provide power to the motor 160 may include three lower switches 111, 112, and 113, and may include a current detection element 120 at a lower end of one lower switch 112. Here, the current detection element 120 may be a shunt resistor. Each of the lower switches 111, 112, and 113 may be combined as one terminal and connected to the GND 170. In order to measure current in 3-phases, the current is measured in the shunt resistor 120 and the two lower switches 111 and 113 to which the shunt resistor 120 is not connected. Each current is a current having a different phase from each other and may have u, v, and w phases, respectively. A first current to a third current are measured by the current measurement unit 130, and current can be measured by detecting a voltage drop component in each element for which current is to be measured.

The current correction unit 140 determines whether the second current and the third current are correct through comparison with the first current measured by the current measurement unit 130, and when it is determined not accurate, the second current or the third current may be corrected. In determining whether the second current and the third current are accurate, it may be determined whether the peak values of a second current and a third current are the same as the peak value of the first current. A second current or a third current different from the peak value of the first current may be corrected.

Figure 3:
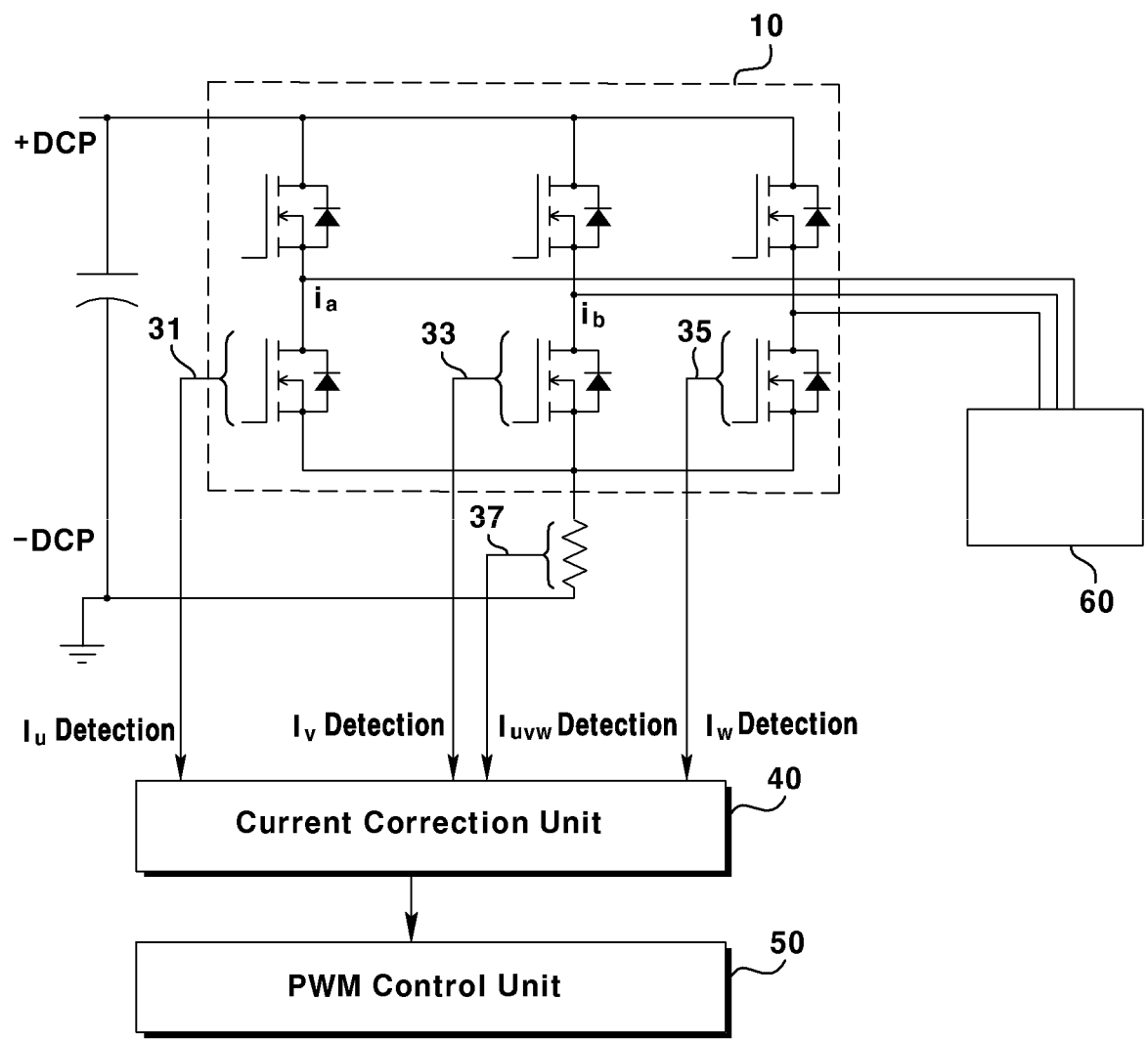
FIG. 3 illustrates a comparative example with respect to a first embodiment of the present invention.

FIG. 3 is a comparative example to a first embodiment of the present invention, and, as shown in FIG. 2, a shunt resistor 37 can be connected to a lower end of a terminal in which all the lower switches 31, 33, and 35 are combined without connecting the shunt resistor to a lower end of one lower switch. In this case, in measuring the current, the current in each of the lower switches and in addition the current in the shunt resistor 120, that is, the current at 4 positions, must be measured. The gate driver IC often includes only three amplification circuits, and in this case, an amplifier such as one separate OP-AMP is required, and four ADC channels may be required. After correcting the current in the current correction unit 40 for the measured current, it is transferred to the PWM control unit 50. In the case of FIG. 3, there is an area in which measurement is impossible except for an area in which a current can be measured using the shunt resistor. Therefore, a separate algorithm is required to compensate for an area that cannot be measured. In addition, when applying these algorithms, since it causes a transformation in the applied PWM method, it is not possible to create an accurate synthesis vector or increases the computation time in the processing unit is increasing due to the generation of asymmetric PWM, and a problem of increasing noise and current ripple may occur. In addition, unlike the implementation embodiment of a first embodiment of the present invention in FIG. 2, as the number of positions to measure current increases, the necessary components increase accordingly, and as a result, the necessary components will be increased, thereby increasing the complexity in calculation of the current correction in the current correction unit 140, and it takes a lot of time, so it may be difficult to react or control promptly.

Figure 4:
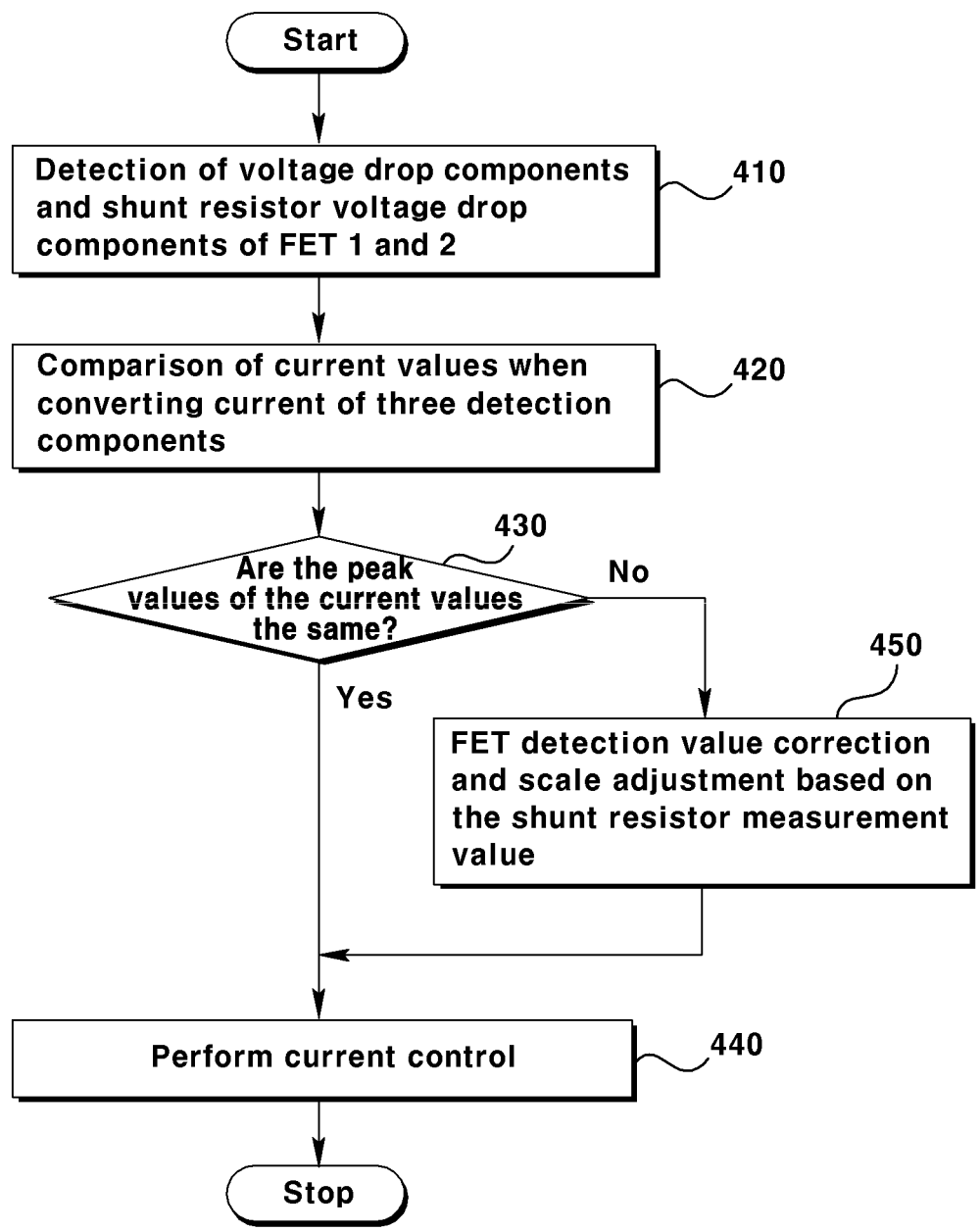
FIGS. 4 and 5 are diagrams for explaining a current measuring process of a 3-phase inverter of a device for measuring current of a 3-phase inverter according to an embodiment of a first embodiment of the present invention.
Figure 5:
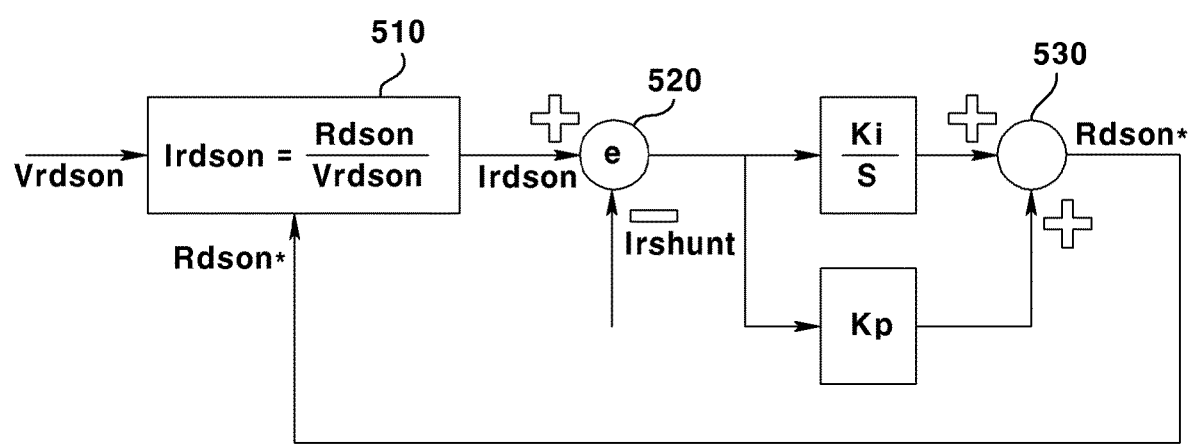

FIGS. 4 and 5 are diagrams for explaining a current measuring process of a 3-phase inverter of a device for measuring current of a 3-phase inverter according to an embodiment of a first embodiment of the present invention, and as shown in FIG. 4, the current of the 3-phase inverter can be measured.

First, a voltage drop component of FETs 1 and 2 that is a lower switch to which a shunt resistor is not connected and a voltage drop component of the shunt resistor are detected (410). Thereafter, in order to increase the accuracy of the measured current, a process of determining the accuracy of the current is performed, and to this end, current values are compared (420) when converting the current of the three detection components. At this time, it is determined whether the peak values of the current values are the same (430). As a result of comparison, if the peak values of the current values are the same, current control is performed using the measured current value without correction (440). However, as a result of the comparison, if the peak values of the current values are different, the FET detection value is corrected based on the shunt resistance measurement value and the scale is adjusted (450). After the correction is made, current control is performed using the corrected current value (440).

A process of performing correction in the current correction unit 140 may be illustrated as shown in FIG. 5.

Although the parasitic resistance component Rdson of the FET varies greatly depending on the ambient temperature and the size of the current, the shunt resistance does not change significantly, so correction can be performed based on the current value in the shunt resistor. By comparing the current value Irshunt measured by the shunt resistor and the current value Irdson measured using Rdson within the same period (510), the PI controller can control the error (e) between the two values to be 0. The error (e) of each measured current value is measured (520), an integrator or multiplier is applied, and the scale can be adjusted so that the error becomes 0 by feeding back Rdson* whose scale is adjusted according to the value derived through this (530).

Since the two current values measured have a phase difference of 120 degrees from each other, control can be performed using the peak value or the peak to peak value. Since the voltage drop component Rdson of the FET is a physical property, it does not fluctuate rapidly, so it is possible to sufficiently follow the control cycle slower than the current control cycle.

As described above, by measuring the current of the 3-phase inverter with one shunt resistor, the effect of three shunt resistors can be obtained using one shunt resistor. In addition, unlike the 3-phase inverter current measurement of FIG. 3, an extra shunt vector control algorithm is not required, so it has strong characteristics against noise and torque ripple. Furthermore, it is possible to increase the preciseness of the current, to reduce the material cost compared to the method using three shunt resistors, to simplify the circuit implementation, and to increase the detection accuracy.

Figure 6:
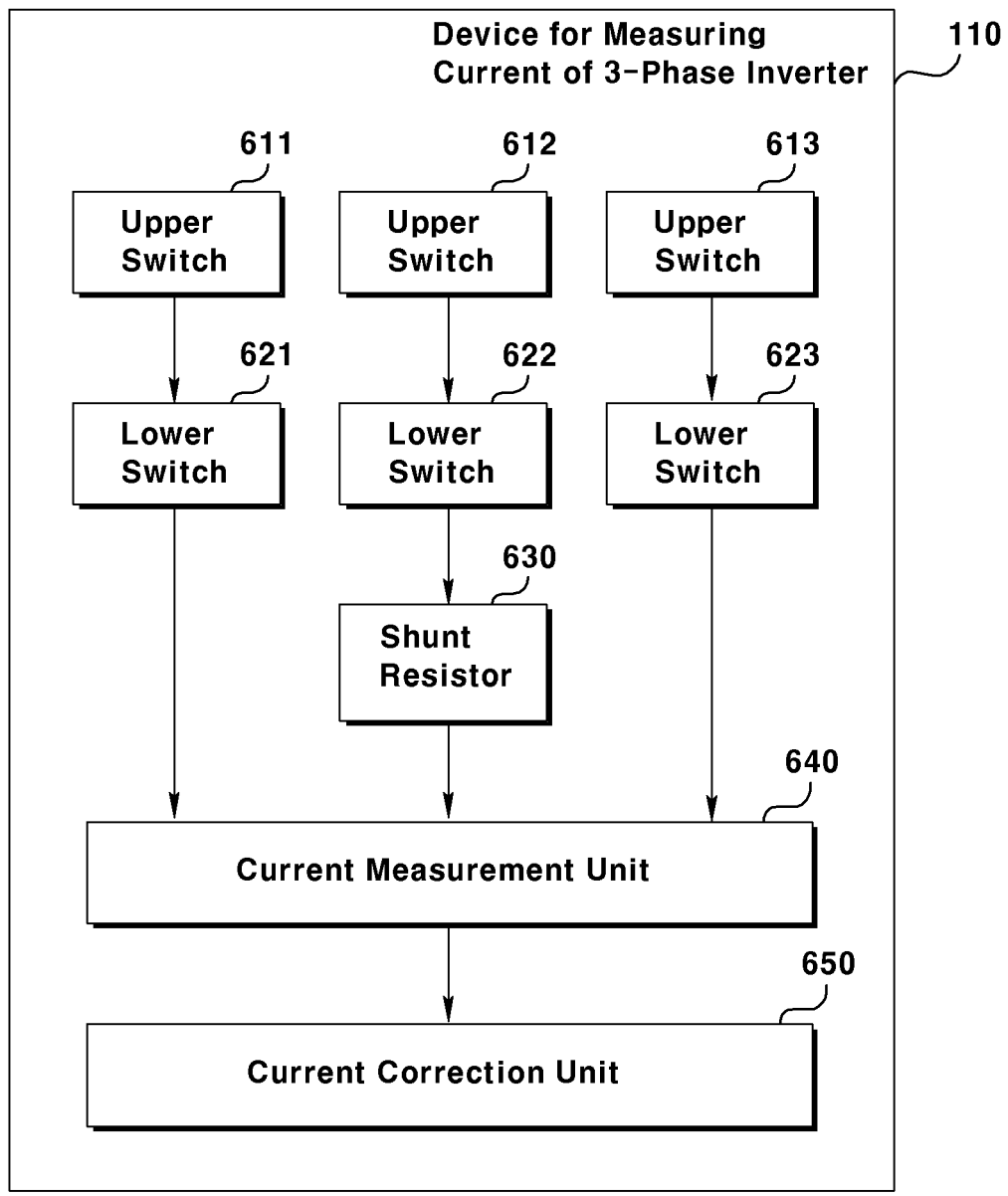
FIG. 6 is a block diagram of a device for measuring current of a 3-phase inverter according to another embodiment of a first embodiment of the present invention.

The 3-phase inverter current measuring device according to an embodiment of a first embodiment of the present invention may be formed as shown in FIG. 6. The detailed description of the 3-phase inverter current measuring device 100 of FIG. 6 corresponds to the detailed description of the 3-phase inverter current measuring device 100 of FIGS. 1 to 5 above, so that the overlapping description will be omitted.

As shown in FIG. 6, the 3-phase inverter current measurement device 100 may comprise: three upper switches 611, 612, and 613 connected in parallel; three lower switches 621, 622, and 623 respectively connected to the three upper switches 611, 612, and 613; a shunt resistor 630 connected to a lower end of the lower switch 622 among the three lower switches 621, 622, and 623; a current measurement unit 640 for measuring a first current value in the shunt resistor 630, a second current value in the two lower switches 621 and 623 to which the shunt resistor 630 is not connected, and a third current value; and a current correction unit 650 for correcting the second current value or the third current value based on the first current value.

Figure 7:
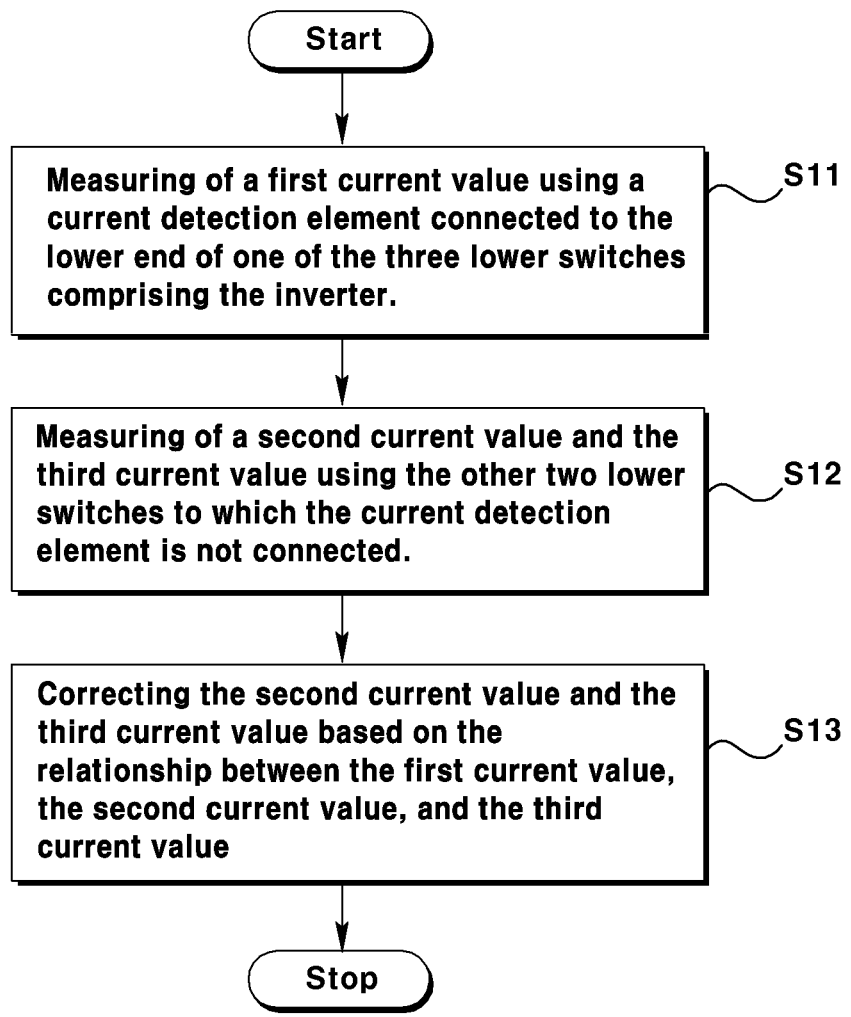
FIG. 7 is a flowchart of a current measuring method of a 3-phase inverter according to an embodiment of a first embodiment of the present invention.
Figure 8:
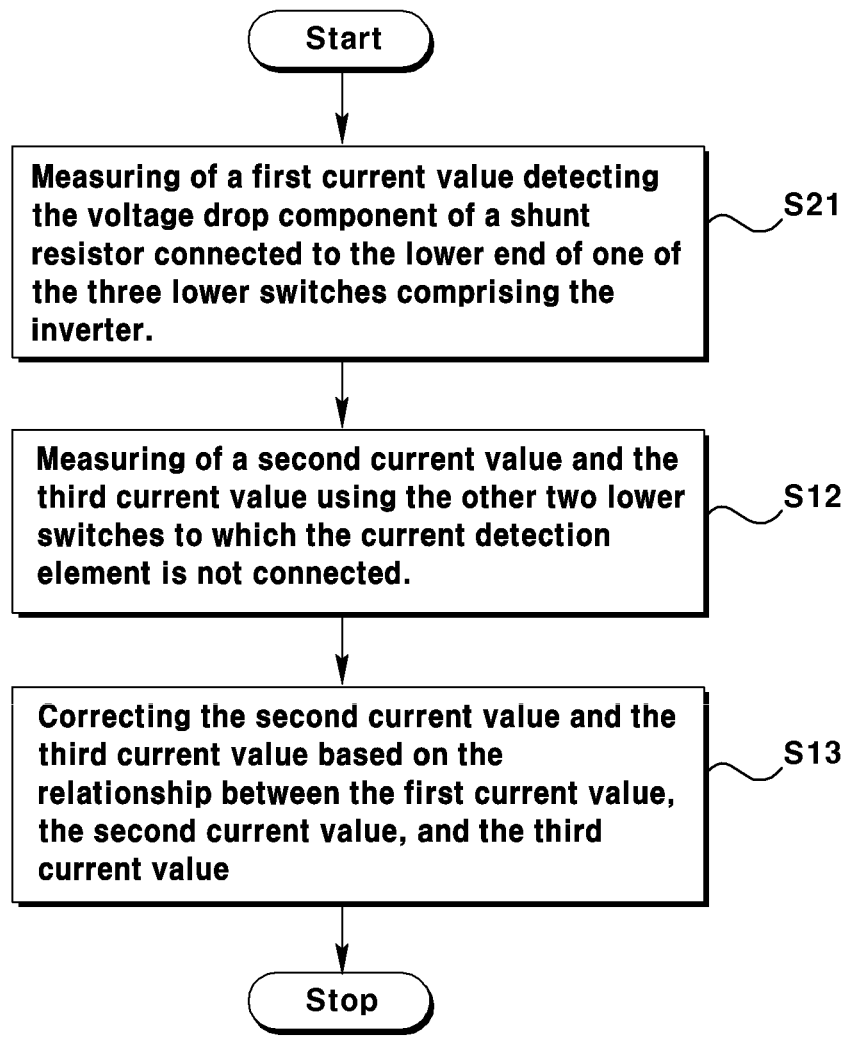
FIGS. 8 to 11 are flowcharts of a current measuring method of a 3-phase inverter according to another embodiment of a first embodiment of the present invention.
Figure 9:
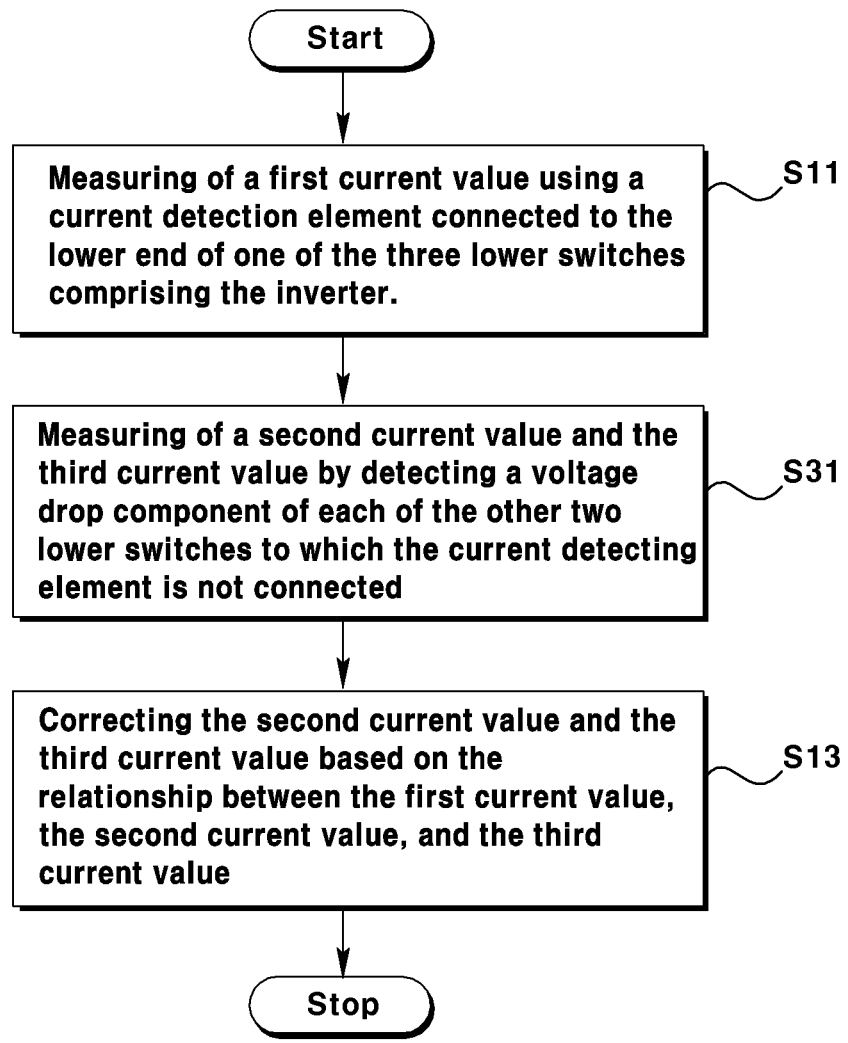

FIG. 7 is a flowchart of a current measuring method of a 3-phase inverter according to an embodiment of a first embodiment of the present invention; and FIGS. 8 to 11 are flowcharts of a current measuring method of a 3-phase inverter according to another embodiment of a first embodiment of the present invention. The detailed description of each step of FIGS. 7 to 11 corresponds to the detailed description of the device for measuring current of 3-phase inverter of FIGS. 1 to 6, and thus the overlapped descriptions will be omitted. Each of the steps of FIGS. 7 to 11 may be performed by one or more processing units.

In order to measure the current of the 3-phase inverter, first, in step S11, a first current value is measured using a current detection element connected to a lower end of one among the three lower switches comprising the inverter.

Here, the current detection element may include a shunt resistor. When a shunt resistor is used as the current detection element, as in step S21, the first current value may be measured by detecting a voltage drop component of the shunt resistor.

Together with step S11 or after step S11, a second current value and a third current value are measured using the other two lower switches to which the current detection element is not connected in step S12. The three phases may have a phase difference of 120 degrees, and steps S11 and S12 may be periodically repeated and performed.

In performing step S12, as in step S31, the second current value and the third current value can be measured by detecting voltage drop component of each of the two lower switches. When the lower switch is an FET, the second current value or the third current value can be measured by measuring the voltage drop caused by the resistance value between both ends of the drain and the source when the lower switch is turned on, and the second current value and the third current value may be measured using each Rdson of the two lower switches.

In step S13, the second current value and the third current value are corrected based on the relationship between the first current value, the second current value, and the third current value measured in the steps S11 and S12.

Figure 10:
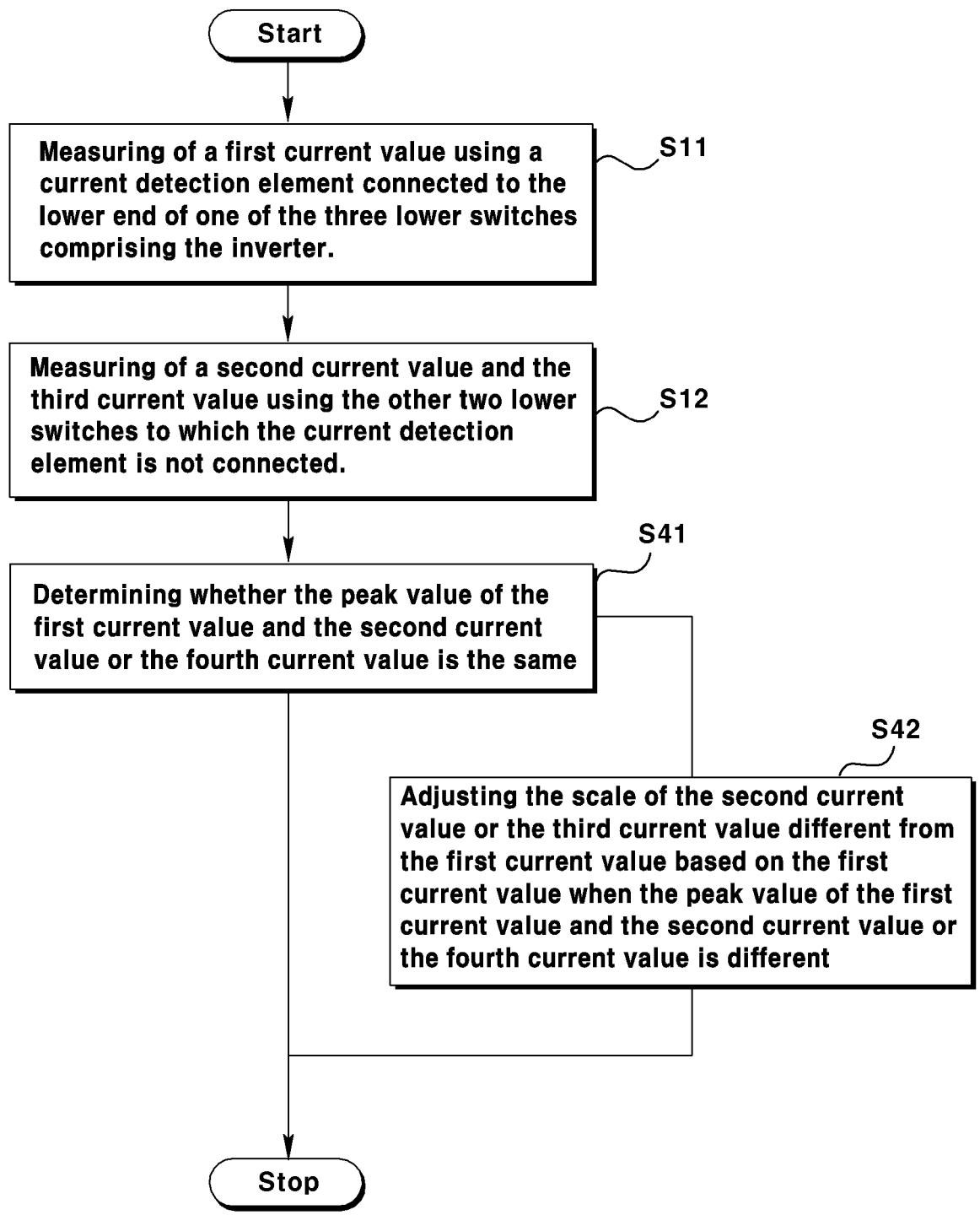
Figure 11:
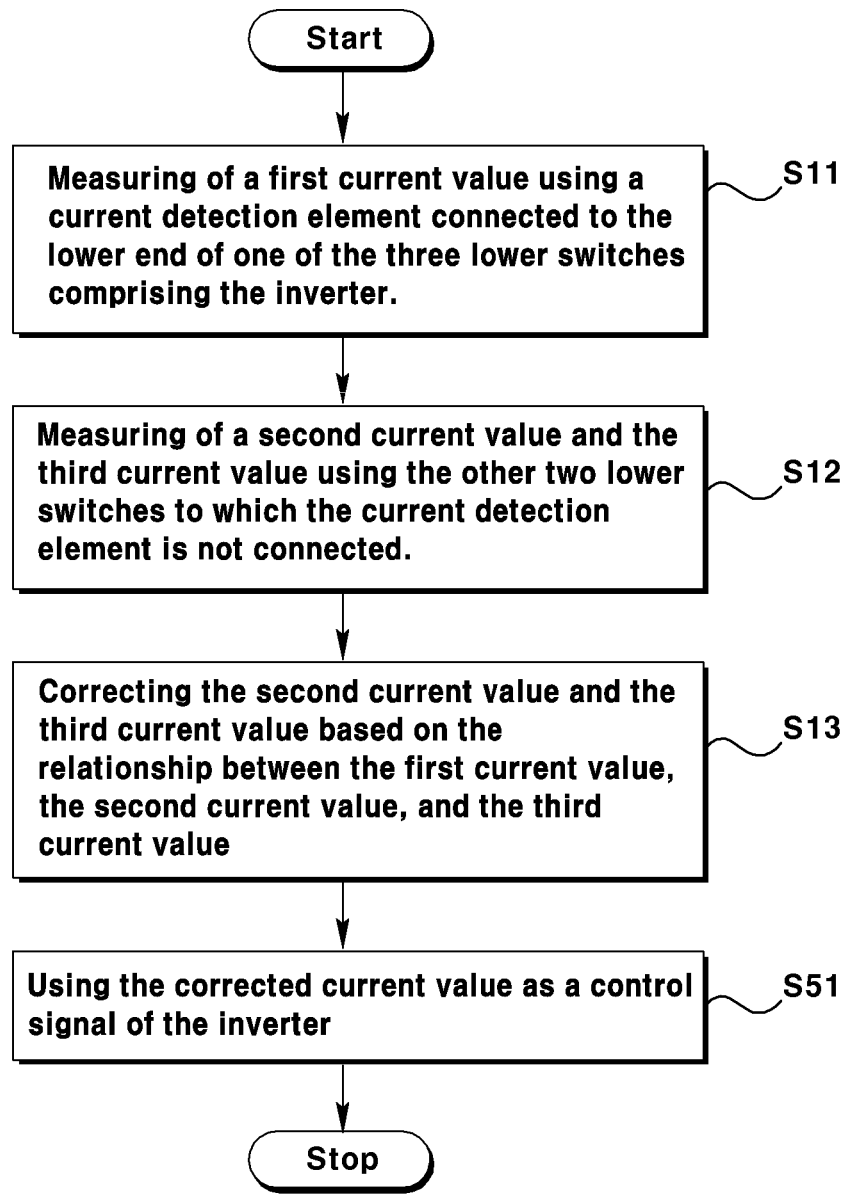

Step S13 may be performed through steps S41 and S42 of FIG. 10. In step S41, it is determined whether the peak value of the first current value and the second current value or the third current value is the same, and as a result of the determination, when the peak value of the first current value and the second current value or the third current value is different, the scale of the second current value or the third current value having a different peak value from the first current value may be adjusted based on the first current value in step S42.

As such, the current value corrected in step S13 may be used as a control signal of the inverter in step S51.

As described above, the device and method for measuring the current of the 3-phase inverter according to a first embodiment of the present invention have been described with reference to FIGS. 1 to 11. Hereinafter, an over current detection circuit and a method thereof according to a second embodiment of the present invention will be described with reference to FIGS. 12 to 28. A detailed description of the over current detection circuit and the method according to a second embodiment of the present invention is based on a device for measuring the current of a 3-phase inverter according to the first embodiment of the present invention and its method, name, term, and function are based on the detailed description of each embodiment, and may be the same as or different from each other.

Hereinafter, the configuration of an over current detection circuit and a method thereof according to a second embodiment of the present invention will be described with reference to the drawings.

Figure 12:
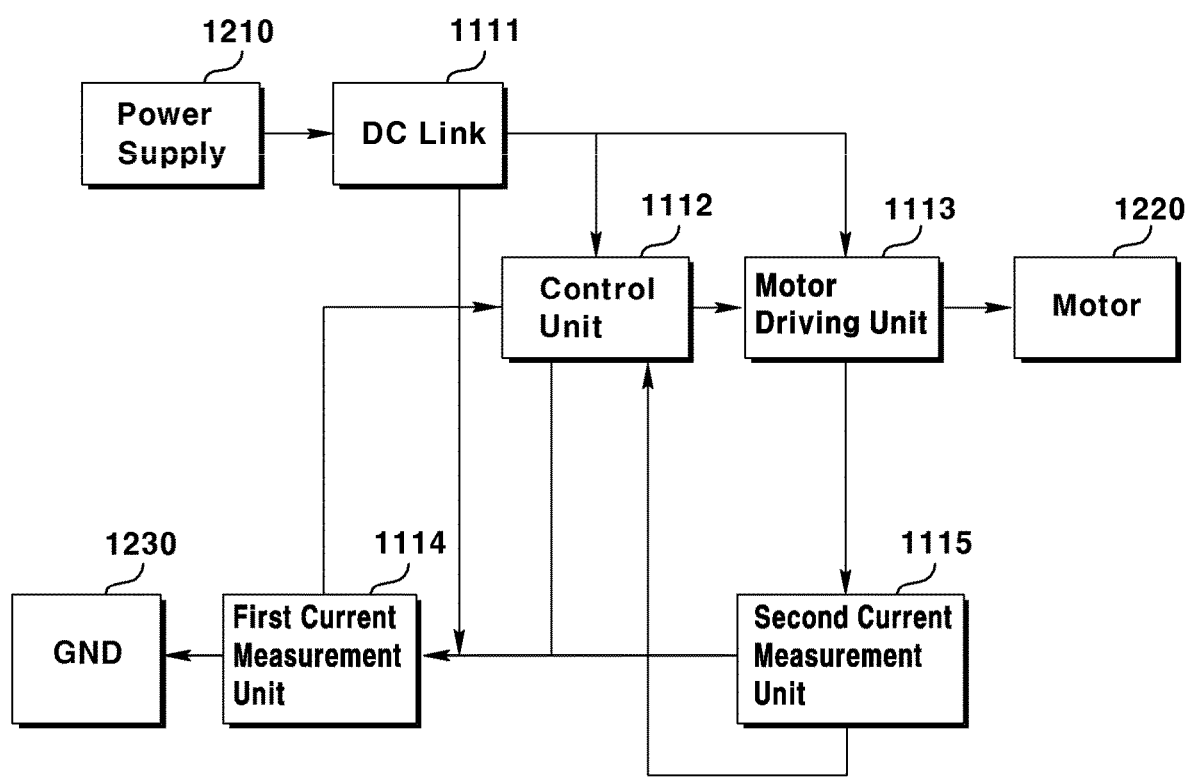
FIG. 12 is a block diagram of an over current detection circuit according to an embodiment of the second embodiment of the present invention.

FIG. 12 is a block diagram of an over current detection circuit according to an embodiment of the second embodiment of the present invention.

An over current detection circuit 1000 according to an embodiment of the second embodiment of the present invention comprises a first current measurement unit 1114, a second current measurement unit 1115, and a control unit 1112.

The first current measurement unit 1114 measures the current of the back end of the terminal into which the DC link current, the control unit current, and the motor driving unit current are combined.

More specifically, in order to detect an over current of the control unit, the current flowing through the components that are affected by or can be affected by the current flowing through the control unit is measured. To this end, the first current measurement unit 1114 measures the current flowing through the DC link 1111, the current flowing through the control unit 1112, and the current of back end of the terminal in which the current flowing through the motor driving unit 1113 are combined. A DC link 1111, a control unit 1112, and a motor driving unit 1113 comprise an ECU. An electronic control unit (ECU) is an electronic control device applied to a vehicle, and the like to drive a motor of the vehicle or to control various devices inside the vehicle. Because ECU controls safety related devices, precision control is important. When an over current occurs in ECU, precision control is difficult, and the over current can cause damage inside ECU, so it is necessary to monitor whether an over current occurs in ECU. Current flowing through ECU can be measured using DC link current, control unit current, and motor driving unit current.

In order to measure the DC link current, the control unit current, and the motor driving unit current at once, the circuit is implemented in a way that the connection lines from the DC link 1111, the control unit 1112, and the motor driving unit 1113 being connected to the ground GND 1230 are combined into one terminal, and the first current measurement unit 1114 measures the current at the back end of the terminal where the DC link current, the control unit current, and the motor driving unit current are combined.

A second current measurement unit 1115 measures a current of the motor driving unit 1113.

More specifically, the second current measurement unit 1115 is connected to the back end of the motor driving unit 1113 to measure the current flowing through the motor driving unit 1113. The second current measurement unit 1115 measures a current flowing through the motor driving unit 1113 for current control in the motor driving unit.

The first current measurement unit 1114 or the second current measurement unit 1115 may include a shunt resistor. A shunt resistor is a resistor with a very low resistance value, and is also called a shunt. A shunt resistor is a resistor that divides the current and is used to measure the current. By connecting a shunt resistor in series to an element to measure the current, the voltage generated by the resistor can be measured to measure the current. The first current measurement unit 1114 may measure the current by connecting a shunt resistor in series to a back end of the terminal into which the current of the DC link, the current of the control unit, and the current of the motor driving unit are combined, and the second current measurement unit 1115 may measure a current by connecting a shunt resistor in series to the motor driving unit.

The control unit 1112 detects the over current flowing in the control unit 1112 by using a first current measured by the first current measurement unit 1114 and a second current measured by the second current measurement unit 1115, and reduces the motor output or reduces the output of the control unit to block the over current.

More specifically, the control unit 1112 detects an over current flowing through the control unit 1112 by using a first current measured by the first current measurement unit 1114 and a second current measured by the second current measurement unit 1115. When an over current flowing through the control unit 1112 is detected, the control unit 1112 reduces the motor output or reduces the output of the control unit, thereby blocking the over current.

Threshold values serving as criteria for determining whether the measured or calculated current corresponds to over current may be preset. The threshold values may be set differently according to the importance or sensitivity of devices through which the over current flows. Or, it may be set by a user. Threshold values to be described below may be set based on the above criteria.

When the first current is greater than the first threshold value and the second current is greater than the second threshold value, the control unit 1112 may reduce the motor output by controlling the motor driving unit until the second current becomes less than or equal to the second threshold value. The control unit 1112 may detect that an over current flows through the control unit 1112 by comparing the first current with a first threshold value.

The first current is the sum of the DC link current, the control unit current, and the motor driving unit current. When the first current is greater than the first threshold value, an over current may also flow in the control unit 1112, and when the first current is greater than a first threshold value, the control unit 1112 may perform a process of blocking the over current. When the first current is greater than the first threshold value, first, it is determined whether a second current that is a current flowing through a motor driving unit in which a large amount of over current may occur is greater than a second threshold value. When the second current is greater than the second threshold value, the over current is generated by the motor driving unit 1113, so the control unit 1112 may reduce the motor output by controlling the motor driving unit 1113 until the second current becomes less than or equal to the second threshold value.

When reducing the motor output, the control unit 1112 may transmit a motor output reduction command to the motor driving unit 1113 to reduce the motor output. When the motor output is reduced, it can be reduced at a preset ratio. For example, when the current motor output is 100%, the motor output may be sequentially reduced to 95% and 90%. The rate at which the motor output is reduced may vary depending on the type of motor. The reduced rate may vary according to the magnitude of the current motor output or may vary according to the number of repetitions of the motor output reduction command. For example, as the number of repetitions of the motor output reduction command increases, the reduction ratio may be increased or decreased.

The motor driving unit 1113 drives the motor 1220 using the power inputted from the power supply. The motor driving unit 1113 may include a 3-phase inverter, and the motor driving unit 1113 may comprise a bridge circuit with six switches and convert DC power into AC power to drive the motor 1220. As for the six switches, three upper switches and three lower switches are paired to form three half-bridge circuits, and the upper and lower switches forming the half-bridge circuits are complementarily conducted to one another to supply power to the motor 1220. The switches of the three half-bridge circuits may provide three-phase AC power to the motor 1220 by operating with a phase difference of 120 degrees from one another. At this time, the on-off operation of the switch is controlled through the time ratio.

Here, the time ratio is the ratio of the time when the current flows to the time when the current does not flow, and in the case of a switch, it means the rate of turning on, and the time ratio is also referred to as a duty ratio. That is, the driving speed or driving time of the motor can be controlled by controlling the rate at which the switch is turned on. In the case of the operating speed, it can be controlled by varying the degree of repeating ON/OFF within a short time. The driving speed becomes slower when the on-off cycle is repeated than when it is continuously turned on.

The control unit 1112 may reduce the motor output by controlling the timing ratio of each switch of the motor driving unit 1113. In addition to the time ratio, various methods for reducing the motor output may be used.

The control unit 1112 may block the power being inputted to the ECU when the number of times of reducing the motor output is greater than or equal to a predetermined number of times or when the second current does not become equal to or less than the second threshold value within a predetermined time. When the second current is greater than the second threshold value, since over current has occurred on the motor driving unit 1113 side, in order to block over current, when the second current does not fall below the second threshold value even though the motor output is reduced by controlling the motor driving unit 1113, the power being inputted to the ECU can be blocked. That is, power being inputted from the power supply 1210 to the DC link 1111, the control unit 1112, and the motor driving unit 1113 may be blocked. To block the power input to the ECU, by connecting the switch to the front end of the control unit 1112 or the power input unit or connector that receives power from the power supply 1210, and then by turning off the switch, the power being inputted to the ECU can be blocked.

In determining whether the power being inputted to the ECU needs to be blocked, the control unit 1112 may determine when the number of times the motor output is reduced is greater than or equal to a predetermined number of times, or a situation in which the second current is greater than the second threshold value continues for a predetermined time or longer. The control unit 1112 may transmit a motor output reduction command to the motor driving unit 1113 in order to reduce the motor output, and when the number of times the motor output reduction command is delivered is more than the preset number, it determines that it is difficult to block over current, and the power being inputted to the ECU can be blocked to protect the ECU. At this time, the number of times to reduce the motor output, which is the standard for blocking the power input to the ECU, is set by a user, or it may vary depending on the sensitivity of the ECU or the required safety level. For example, when the over current is maintained even after the reduction in motor output 1 time, the power input to the ECU can be blocked immediately, and it is also possible to block the power input to the ECU after reducing the motor output 100 times.

Or, it is determined that it is difficult to block the over current even when the generation of over current continues for more than a preset time, the power input to the ECU can be blocked in order to protect the ECU. The elapsed time that is the criterion for blocking the power input to the ECU is set by a user, or it may vary depending on the sensitivity of the ECU or the required safety level. After the motor output is reduced, the time required to determine whether the second current is greater than the second threshold value again may be constant, and the elapsed time may be set according to the number of repetitions of the corresponding time.

When the first current is greater than a first threshold value and the second current is less than or equal to a second threshold value, the control unit 1112 may reduce the output of the control unit until the third current obtained by subtracting the second current from the first current becomes less than or equal to a third threshold value. When the first current is greater than the first threshold value and the second current is greater than the second threshold value, an over current has occurred in the motor driving unit 1113, and when the second current is less than or equal to the second threshold value under a situation where the first current is greater than the first threshold value, the motor driving unit 1113 does not have over current, and it means that an over current has occurred in the DC link 1111 or the control unit 1112 other than the motor driving unit 1113. By subtracting the second current from the first current, a third current that is the sum of the DC link current and the control unit current excluding the motor driving unit current may be calculated. The control unit 1112 may reduce the output of the control unit 1112 until the third current becomes less than or equal to the third threshold value. It is also possible to reduce the DC link output other than the control unit output, or reduce the control unit output and the DC link output at the same time.

The control unit 1112 outputs various control signals for controlling devices inside the ECU. The control unit 1112 may comprise a PMIC, an MCU, a gate driver IC, and the like. A power management integrated circuit (PMIC) is a power management IC; a micro controller unit (MCU) is an IC including a microprocessor and input/output module; and gate driver IC is an IC that receives a low power input from MCU and applies power to the gate, such as an IGBT or MOSFET. The control unit 1112 may reduce the output of the control unit 1112 for outputting various control signals as described above to block an over current. By reducing the number of control signals being outputted from the control unit 1112, the output of the control unit 1112 may be reduced. Or, the output of the control unit 1112 may be reduced by reducing the frequency of outputting the control signal. It is possible to set the priority according to the importance of the control signal, and set the control signal for reducing the output according to the priority.

The control unit 1112 may block the power being inputted to the ECU when the number of times of reducing the output of the control unit is equal to or greater than a predetermined number of times or the third current does not become equal to or less than the third threshold value within a predetermined time. In order to block the over current, even when the output of the control unit 1112 is reduced, when the third current does not fall below the third threshold value, the power being inputted to the ECU may be blocked. That is, power being inputted from the power supply 1210 to the DC link 1111, the control unit 1112, and the motor driving unit 1113 may be blocked.

In determining whether the power being inputted to the ECU needs to be blocked, the control unit 1112 may determine when the number of times the control unit output is reduced is greater than or equal to a predetermined number of times, or a situation in which the third current is greater than the third threshold value continues for a predetermined time or longer. The control unit 1112 may command a control unit output reduction in order to reduce the control unit output, and when the number of times the control unit output reduction is commanded is more than the preset number, it determines that it is difficult to block over current, and the power being inputted to the ECU can be blocked to protect the ECU. At this time, the number of times to reduce the control unit output, which is the standard for blocking the power input to the ECU, is set by a user, or it may vary depending on the sensitivity of the ECU or the required safety level. For example, if the over current is maintained even after the control unit output reduction 1 time, the power input to the ECU can be blocked immediately, and it is also possible to block the power input to the ECU after the control unit output reduction 100 times.

Or, it is determined that it is difficult to block the over current even when the generation of over current continues for more than a preset time, the power input to the ECU can be blocked in order to protect the ECU. The elapsed time that is the criterion for blocking the power input to the ECU is set by a user, or it may vary depending on the sensitivity of the ECU or the required safety level. After the motor output is reduced, the time required to determine whether the third current is greater than the third threshold value again may be constant, and the elapsed time may be set according to the number of repetitions of the corresponding time.

In addition, the control unit 1112 may transfer an alarm to an upper level controller when detecting an over current flowing in the control unit 1112. When detecting an over current, the control unit 1112 may transmit information indicating that an over current has been detected to the upper level controller. At this time, it is possible to deliver over current detection information to the upper level controller through an alarm. In addition to detecting over current, when the power input to the ECU is blocked, information on blocking the power input to the ECU can be transmitted to the upper level controller through an alarm, and the like.

Figure 13:
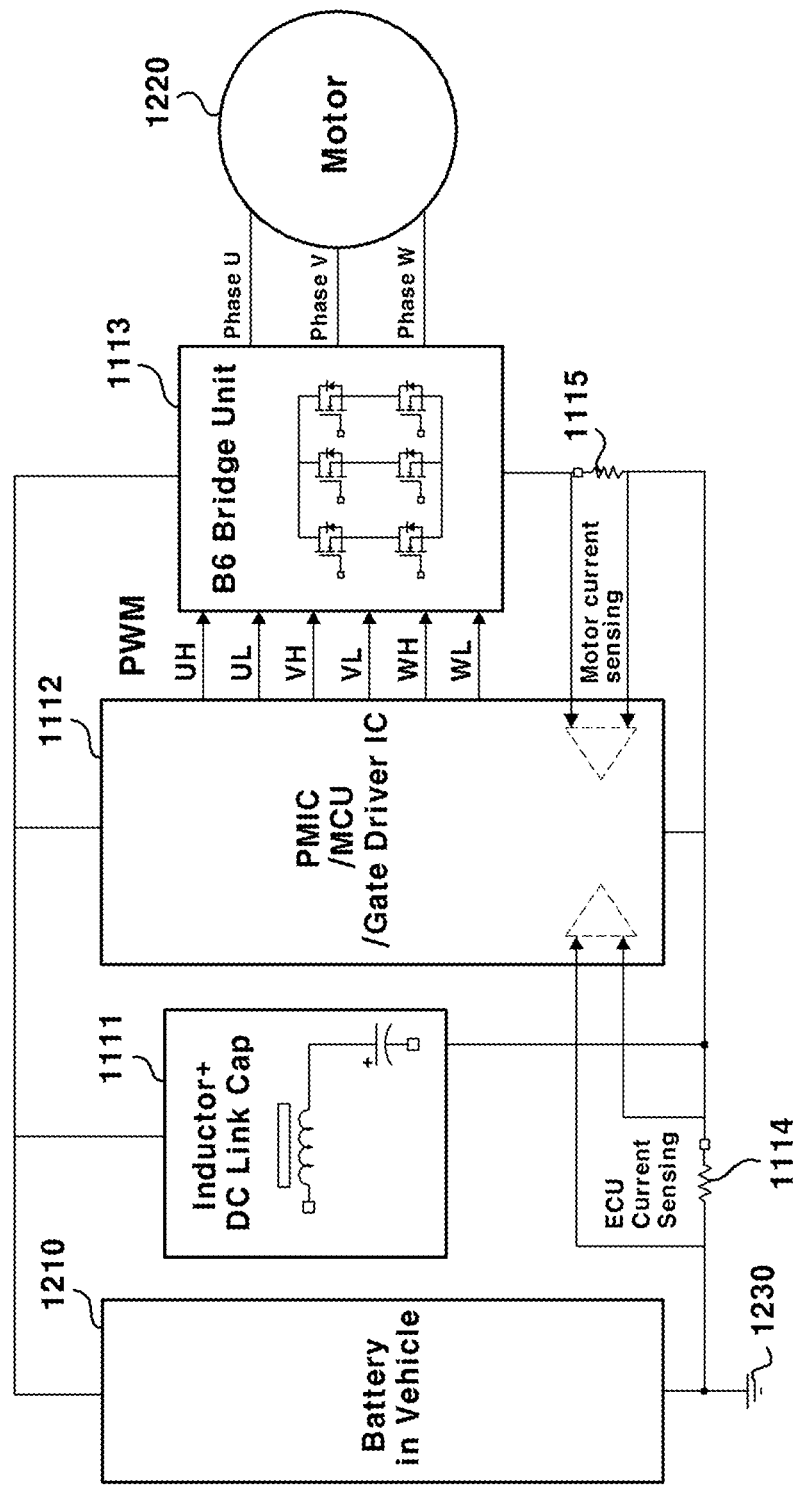
FIG. 13 illustrates an implementation example of an over current detection circuit according to an embodiment of the second embodiment of the present invention.
Figure 14:
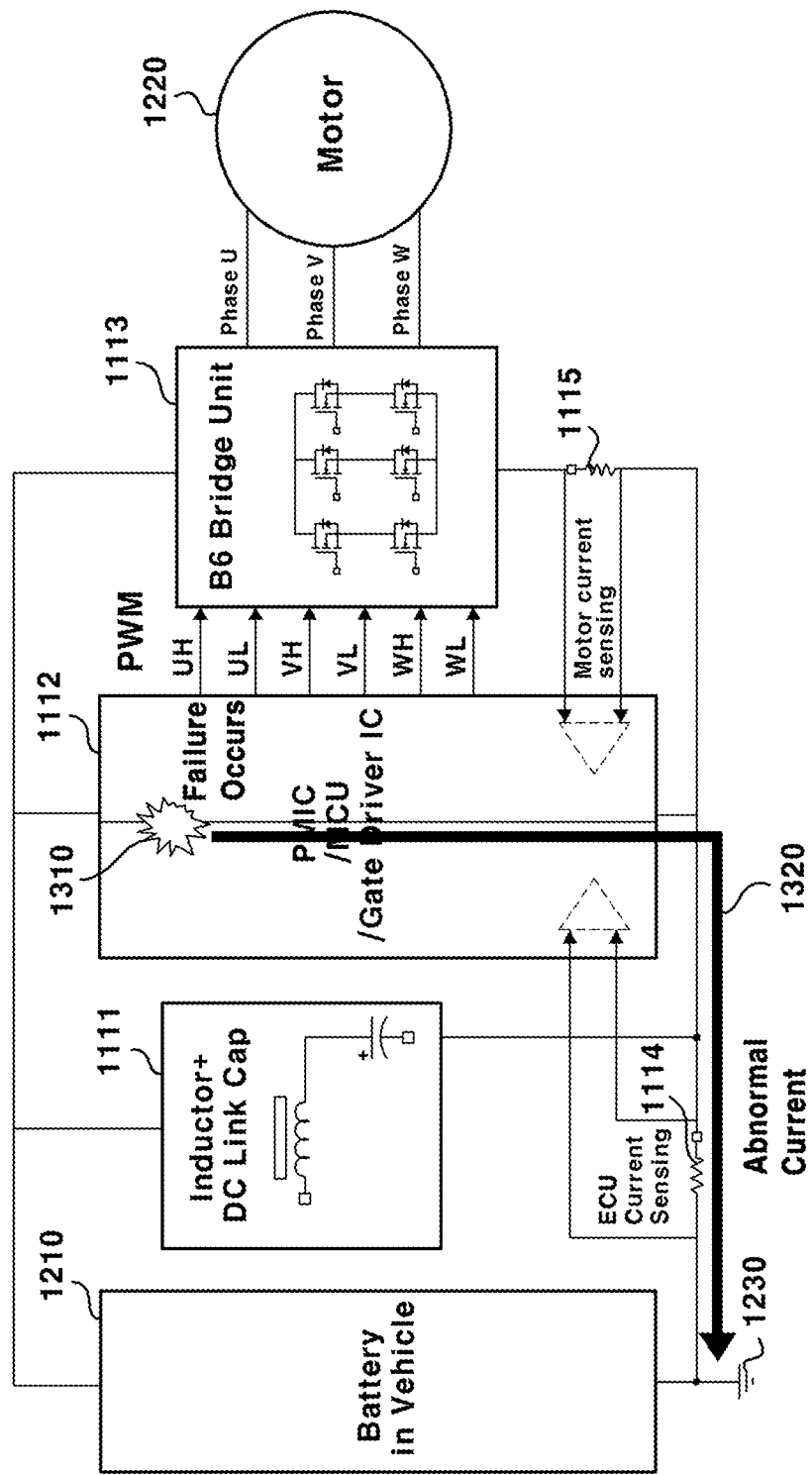
Figure 15:
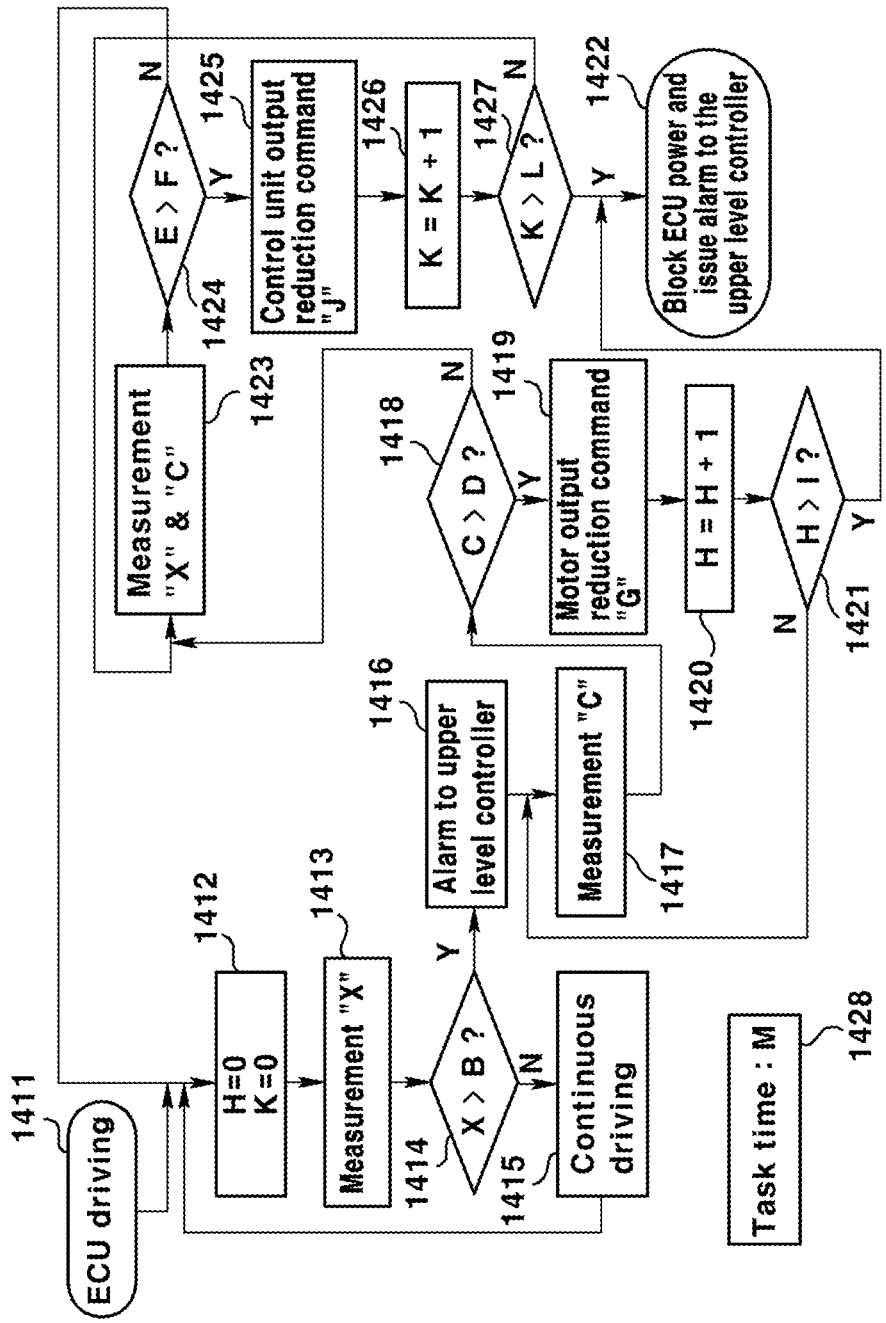

FIG. 13 illustrates an implementation example of an over current detection circuit according to an embodiment of the second embodiment of the present invention; and FIGS. 14 to 16 are diagrams for explaining the operation of an over current detection circuit according to an embodiment of a second embodiment of the present invention.

FIG. 13 is an implementation example in which an over current detection circuit is applied to an ECU that drives a motor mounted on a vehicle. The power supply 1210 may be a battery inside the vehicle, and the motor driving unit 1113 may comprise a B6 bridge unit. In the motor driving unit 1113, a power source having U, V, and W phases, which are 3-phase power source, is applied to the motor 1220 to drive the motor. The control unit 1112 comprises a PMIC, an MCU, a gate driver IC, and the like, and outputs control signals for controlling six switches comprising the motor driving unit 1113 to control the motor driving unit 1113. At this time, the control unit 1112 may control the switch of the motor driving unit 1113 in a pulse width modulation (PWM) method. The DC link 1111 may include an inductor and a DC link capacitor. The lines being outputted from the DC link 1111, the control unit 1112, and the motor driving unit 1113 to the ground GND 1230 are combined and formed to be connected to the GND 1230 as one line. In a line in which lines being outputted from the DC link 1111, the control unit 1112, and the motor driving unit 1113 are combined, a current detection element for measuring the current of ECU, which is a first current measurement unit 1114, is connected to measure the entire current of the ECU; and in a line being outputted from the motor driving unit 1113 to the ground GND 1230, a current detection element for measuring the motor current, which is a second current measurement unit 1115, is connected to measure the current of the motor driving unit 1113. A shunt resistor can be used as a current detection element.

As shown in FIG. 14, when a failure 1310 occurs in the control unit 1112, an abnormal current 1320 such as an over current flows in the control unit 1112, and over current flowing from the first current measurement unit 1114 to the control unit 1112 can be measured. At this time, since the current detected by the first current measurement unit 1114 is the current of the entire ECU, first, the motor output is reduced by controlling the motor driving unit 1113, and when the over current is maintained even after that, the over current can be blocked by reducing the output of the control unit.

The process of detecting an over current and blocking the over current may be performed as shown in FIG. 15. Each symbol of FIG. 15 is the same as that of FIG. 16. When the ECU driving (1411) is started, the number of motor unit output reduction commands H and the number of control unit output reduction commands K are initialized to 0 (1412). Thereafter, ECU current measurement value X is measured (1413). It is determined whether the measured X is greater than ECU current limit value B (1414). If X is less than or equal to B, continuous driving (1415) is performed. If X is greater than B, an alarm is issued to the upper level controller (1416), a motor driving unit current measurement value C is measured (1417), and whether C is greater than a motor driving unit current limit value D is determined (1418). When C is greater than D, a reduction command (1419) according to the motor unit output reduction ratio G is issued for the motor output, H is changed to H+1 (1420), and it is determined whether H is greater than Number of motor unit output reduction commands limit value I (1421). Then, when H is less than or equal to I, steps 417 to 421 are repeated until C is equal to or less than D. If H is greater than I, the ECU power is blocked and an alarm is issued to the upper level controller (1422). As a result of step 418, if C is less than or equal to D, then X and C are measured (1423). It is determined whether the control unit current calculated value E derived from the measured X and C (E=X−C) is greater than the control unit current limit value F (1424). If E is greater than F, give a reduction command (1425) according to the control unit output reduction ratio J for the control unit output, K is changed to K+1 (1426), and it is determined whether K is greater than the number of control unit output reduction commands limit value L (1427). Then, when K is L or less, steps 423 to 427 are repeated until E is equal to or less than F. If K is greater than L, the ECU power is blocked and an alarm is issued to the upper level controller (1422). As a result of step 424, if E is less than or equal to F, it is determined that the over current is blocked, and H and K are initialized (1412) to perform a normal operation. The task time performed from steps 412 to 422 may be performed to be less than or equal to M (1428) or less.

Figure 17:
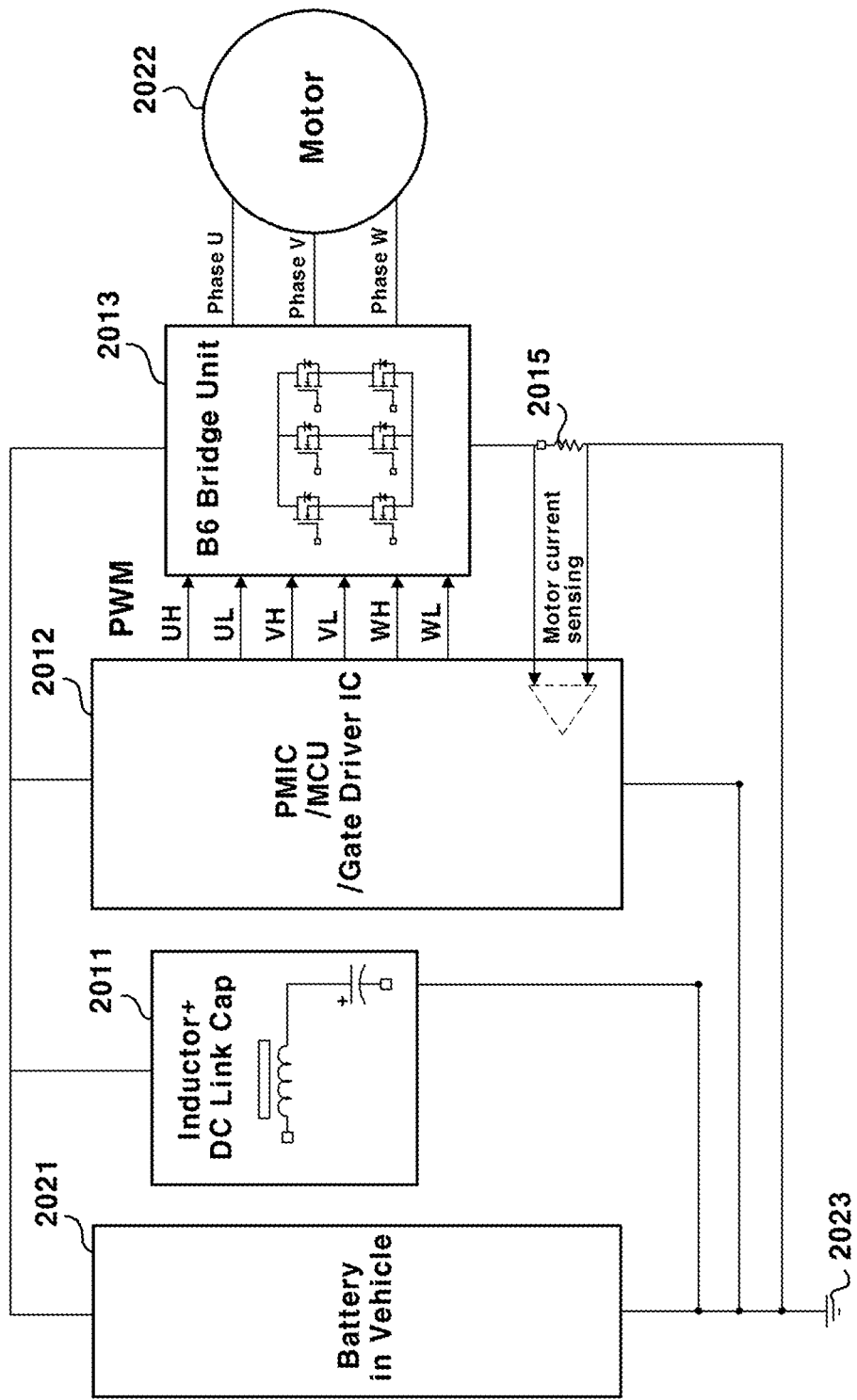
FIGS. 17 and 18 illustrate comparative examples of over current detection circuits according to embodiments of a second embodiment of the present invention.
Figure 18:
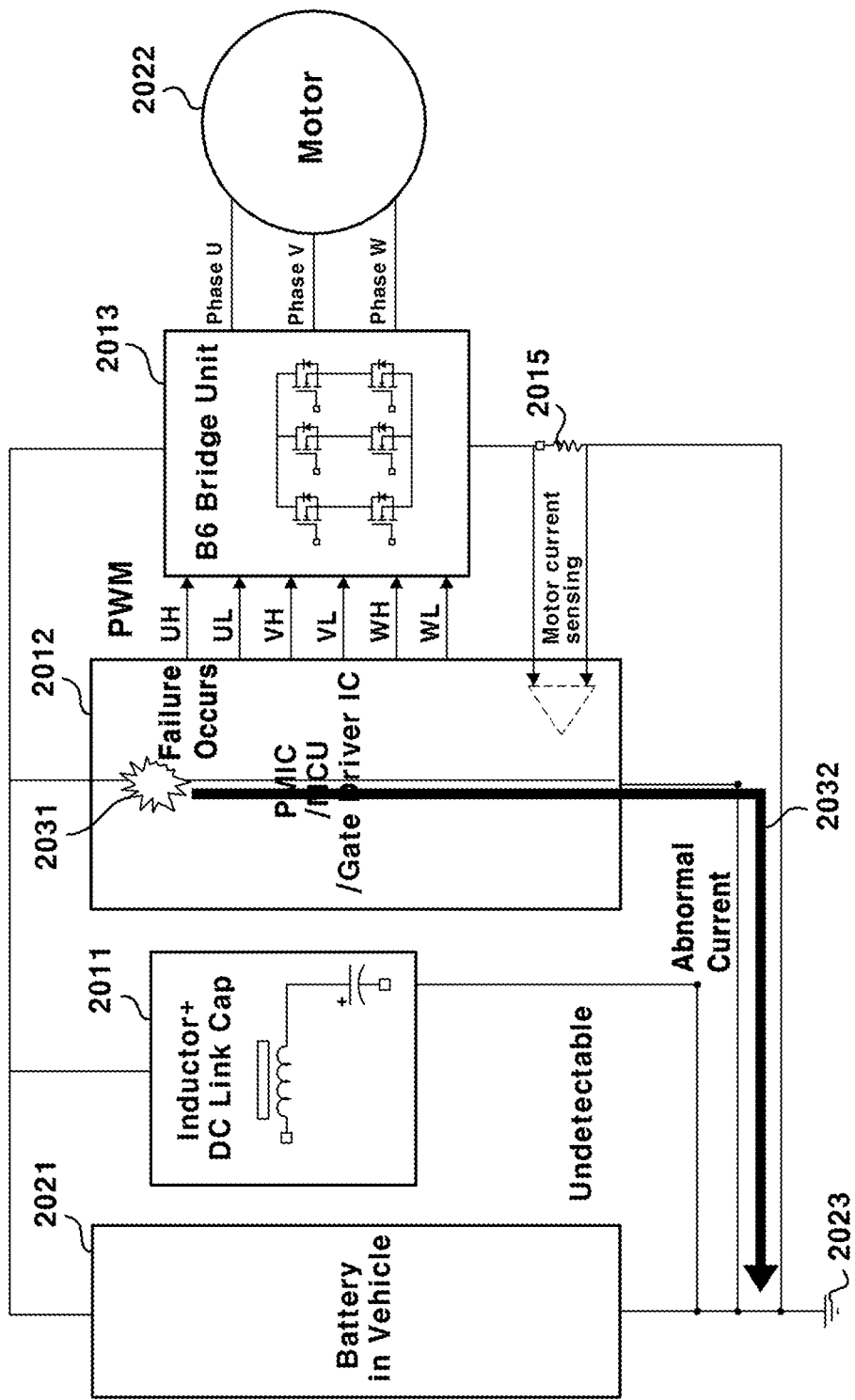

FIGS. 17 and 18 illustrate comparative examples of over current detection circuits according to embodiments of a second embodiment of the present invention, unlike the over current detection circuit of FIG. 13, power is inputted from the power supply 2021; the DC link 2011, the control unit 2012, and the motor driving unit 2013 are respectively connected to the GND 2023 through a separate line; and the current detection element 2015 is connected only to the motor driving unit 2013 that drives the motor 2022 to measure the motor current.

Figure 19:
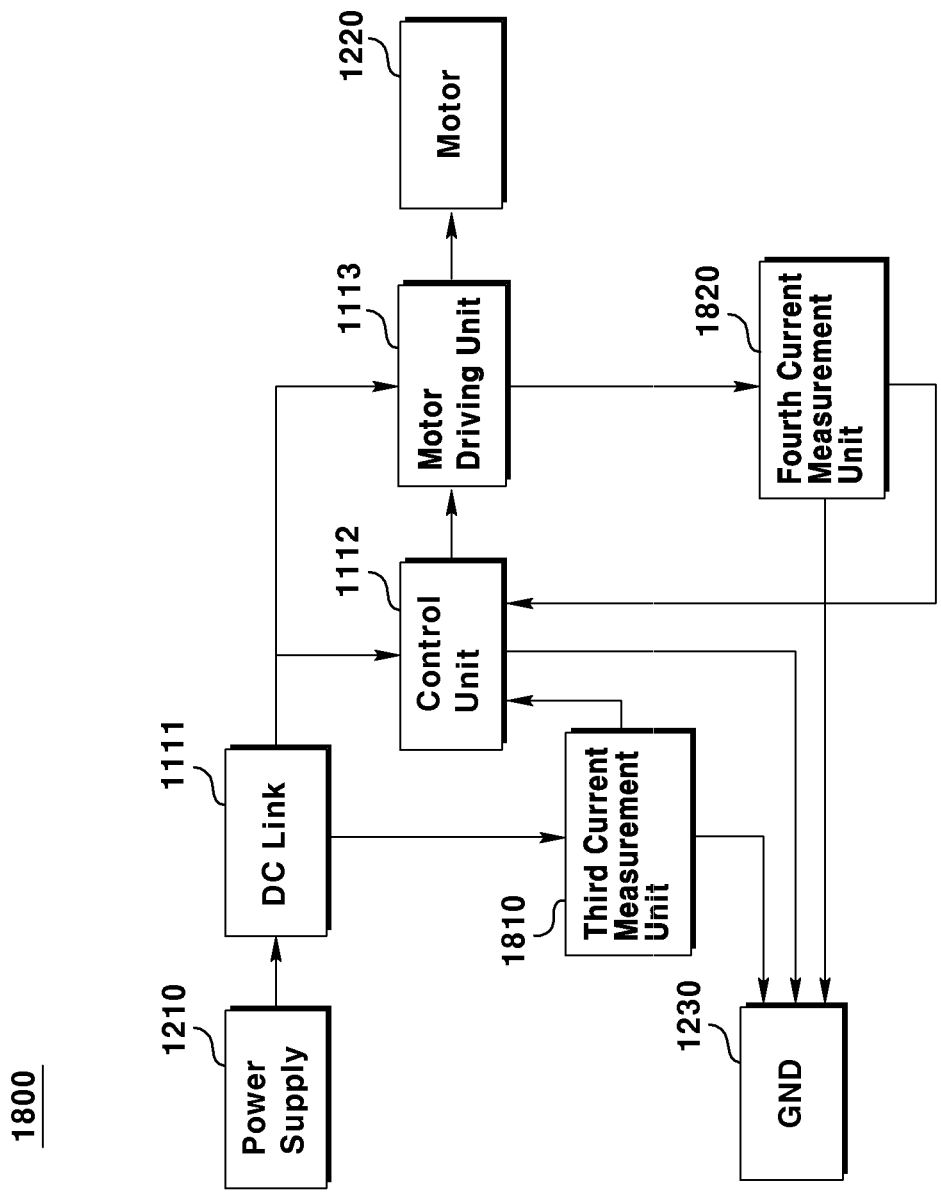
FIG. 19 is a block diagram of an over current detection circuit according to another embodiment of a second embodiment of the present invention.

FIG. 19 is a block diagram of an over current detection circuit according to another embodiment of a second embodiment of the present invention.

An over current detection circuit 1800 according to another embodiment of a second embodiment of the present invention comprises a third current measurement unit 1810, a fourth current measurement unit 1820, and a control unit 1112.

Unlike the over current detection circuit 1000 according to an embodiment of a second embodiment of the present invention in FIG. 12, in the over current detection circuit 1800 according to another embodiment of a second embodiment of the present invention, the connection lines connecting the DC link 1111, the control unit 1112, and the motor driving unit 1113 to the GND 1230 are not combined but are connected separately. By comprising a third current measurement unit 1810 for measuring the current of the DC link and a fourth current measurement unit 1820 for measuring the current of the motor driving unit 1113, the control unit 1112 may detect and block an over current by using the third current measurement unit 1810 and the fourth current measurement unit 1820. Since the DC link current and the motor driving unit current are significantly larger than the control unit current, and because it is possible to determine the over current of the ECU only by measuring the DC link current and the motor driving unit current, the over current can be detect and blocked sufficiently by using the third current measurement unit 1810 and the fourth current measurement unit 1820. In the detailed description of an over current detection circuit according to another embodiment of the second embodiment of the present invention in FIG. 19, parts corresponding to except for parts different from the detailed description of the over current detection circuit 1000 according to an embodiment of the second embodiment of the present invention in FIGS. 12 to 18 will be omitted below.

The third current measurement unit 1810 measures a current of the DC link 1111, and the fourth current measurement unit 1820 measures a current of the motor driving unit 1113. The third current measurement unit 1810 is connected in series to the DC link, and the fourth current measurement unit 1820 is connected in series to the motor driving unit 1113 to measure a fourth current and a fifth current, respectively. The fourth current measurement unit 1820 may have the same configuration as the second current measurement unit 1115 of FIG. 12.

The control unit 1112 detects an over current using the fourth current measured by the third current measurement unit 1810 and the fifth current measured by the fourth current measurement unit 1820, and reduces the motor output or reduce the control unit output to block the over current.

The control unit 1112 determines that when the sum of the fourth current and the fifth current has a sixth current greater than a fourth threshold value, and the fifth current is greater than a fifth threshold value, the motor output may be reduced by controlling the motor driving unit until the fifth current becomes less than or equal to the fifth threshold value. The current of the entire ECU may be detected using the sixth current obtained by adding the fourth current and the fifth current. Although the ECU current should further include a current flowing through the control unit to the fourth current and the fifth current, since the current flowing through the control unit is significantly smaller than the fourth current flowing through the DC link, the over current is determined using the fourth current and the fifth current.

In order to determine an over current, the control unit 1112 calculates a sixth current by summing the fourth current and the fifth current to determine whether the sixth current is greater than a fourth threshold value. When the sixth current is greater than the fourth threshold value, an over current has occurred in the ECU, in order to block the over current, first, the control unit 1112 determines whether an over current is generated in the motor driving unit 1113 using the fifth current. When the fifth current is greater than the fifth threshold value, it is determined that an over current has occurred in the motor driving unit 1113, and the motor output can be reduced by controlling the motor driving unit 1113.

When the number of times of reducing the motor output is greater than or equal to a predetermined number or when the fifth current does not become less than or equal to the fifth threshold value within a predetermined time, the control unit 1112 may block the power being inputted to the ECU. In order to block the over current, when the fifth current does not fall below the fifth threshold value, even when the output of the motor driving unit 1113 is reduced, the control unit 1112 may block the power being inputted to the ECU. That is, the power being inputted from the power supply 1210 to the DC link 1111, the control unit 1112, and the motor driving unit 1113 may be blocked.

Or, it is determined that it is difficult to block the over current even when the generation of over current continues for more than a preset time, and the power being inputted to the ECU may be blocked to protect the ECU. The elapsed time, which is the criterion for blocking the power input to the ECU, may be set by a user or may vary depending on the ECU's sensitivity or required safety level. After the motor output is reduced, since the time required to determine whether the fifth current is greater than the fifth threshold value again may be constant, the above described elapsed time may be set according to the number of repetitions of the corresponding time.

When a sixth current that is the sum of the fourth current and the fifth current is greater than a fourth threshold value, and the fifth current is less than or equal to a fifth threshold value, the control unit 1112 may reduce the output of the control unit until the fourth current is equal to or less than a sixth threshold value. When the sixth current is greater than the fourth threshold value and the fifth current is greater than the fifth threshold value, an over current has occurred in the motor driving unit 1113, however, when the sixth current is greater than the fourth threshold value and the fifth current is less than or equal to the fifth threshold value, since an over current has not occurred in the motor driving unit 1113, it means that an over current has occurred in the DC link 1111 or the control unit 1112 other than the motor driving unit 1113. At this time, the control unit 1112 may reduce the output of the control unit 1112 or reduce the DC link output other than the control unit output until the fourth current is equal to or less than the sixth threshold value. Or, the control unit output and DC link output may be reduced simultaneously.

When the number of times of reducing the output of the control unit is greater than or equal to a predetermined number of times or when the fourth current does not become less than or equal to the sixth threshold value within a predetermined time, the control unit 1112 may block the power being inputted to the ECU. In order to block the over current, even when the output of the control unit 1112 is reduced, when the fourth current does not become equal to or less than the sixth threshold value, the power being inputted to the ECU may be blocked. That is, power being inputted from the power supply 1210 1210 to the DC link 1111, the control unit 1112, and the motor driving unit 1113 may be blocked.

When detecting an over current flowing through the control unit 1112, the control unit 1112 may transmit an alarm to the upper level controller. When over current is detected, the control unit 1112 can transmit information that an over current has been detected to the upper level controller. At this time, it is possible to deliver over current detection information to the upper level controller through an alarm. In addition to over current detection, when the power input to the ECU is blocked, information on blocking the power input to the ECU can be transmitted to the upper level controller through an alarm, and the like.

Figure 20:
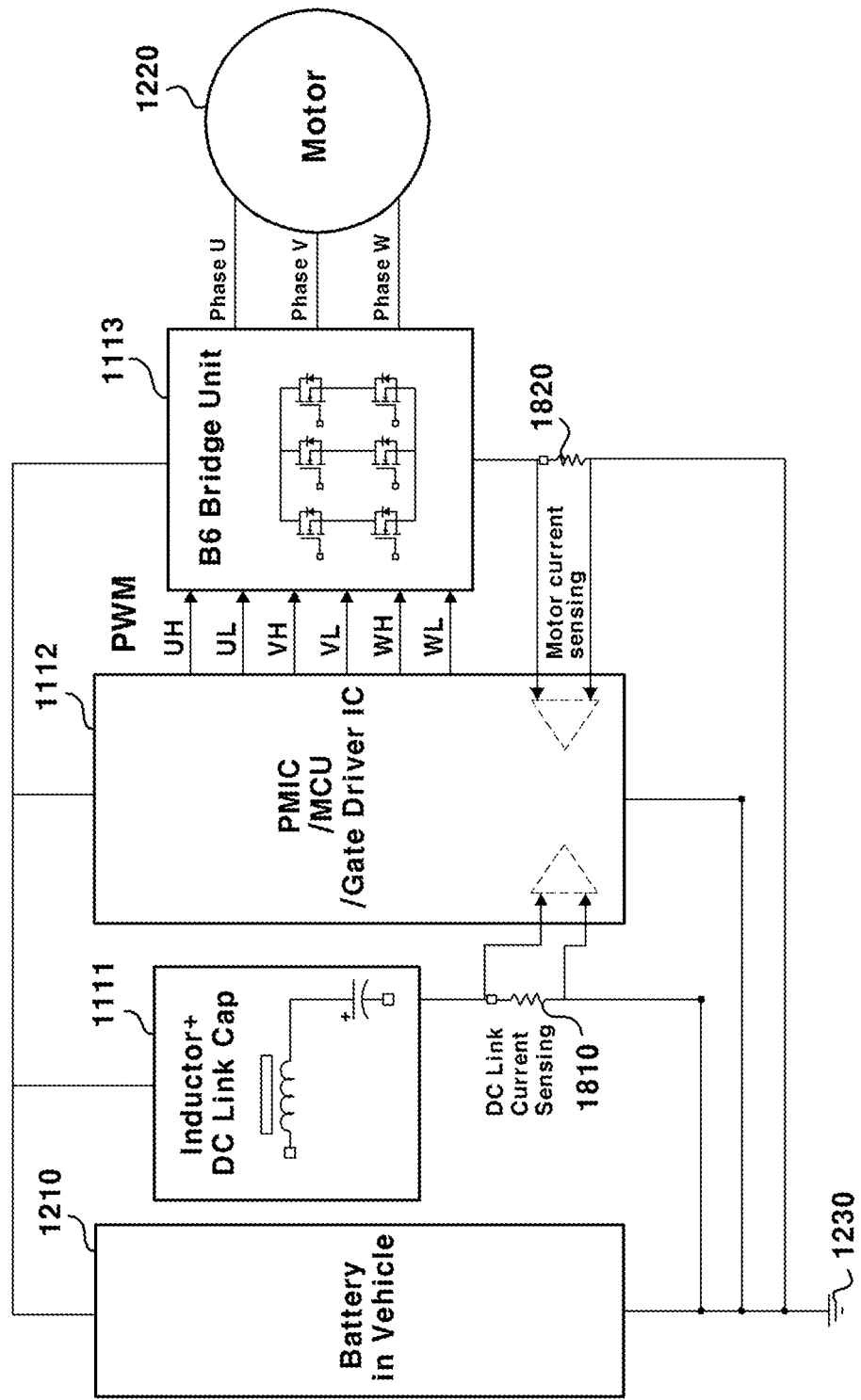
FIG. 20 illustrates an implementation example of an over current detection circuit according to another embodiment of a second embodiment of the present invention.

FIG. 20 illustrates an implementation example of an over current detection circuit according to another embodiment of a second embodiment of the present invention, and a current detection element, which is the third current measurement unit 1810, is connected to the back end of the DC link 1111 to the circuit corresponding to the over current detection circuit of FIG. 17, and through this the DC link current can be measured. When an over current flows inside the ECU, an over current may be detected using the current measured by the third current measurement unit 1810 and the fourth current measurement unit 1820. At this time, the current detected by the fourth current measurement unit 1820 is the motor driving unit current, and firstly, the motor output is reduced by controlling the motor driving unit 1113, and if the over current is maintained even thereafter, the over current can be blocked by reducing DC link output or control unit output.

Figure 21:
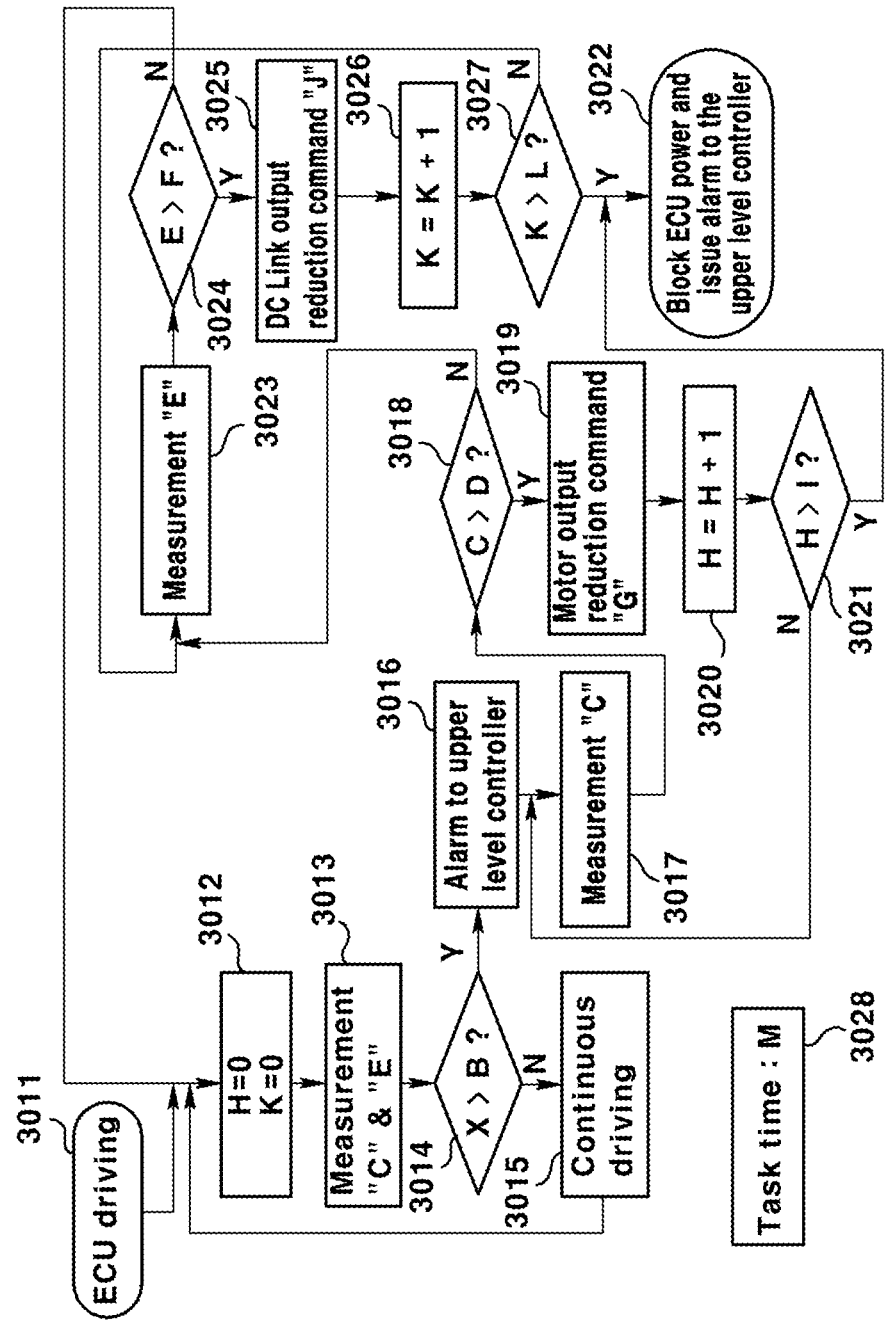

The process of detecting the over current and blocking the over current may be performed as shown in FIG. 21. Although FIG. 21 is illustrated as an example of reducing the motor output or the DC link output, over current may be blocked by reducing the control unit output other than the DC link output. Each symbol of FIG. 21 is the same as that of FIG. 22. When ECU driving (3011) is started, the number of motor unit output reduction commands H and the number of DC Link (control unit) output reduction commands K are initialized to 0 (3012). Thereafter, the motor driving unit current measurement value C and the DC Link current measurement value E are measured (3013). It is determined whether the ECU current measurement value X derived from the measured C and E (X=C+E) is greater than the ECU current limit value B (3014). If X is less than or equal to B, continuous driving is performed (3015). If X is greater than B, an alarm is issued to the upper level controller (3016), a motor driving unit current measurement value C is measured (3017), and it is determined whether C is greater than the motor driving unit current limit value D (3018). When C is greater than D, a reduction command is issued according to the motor unit output reduction ratio G for the motor output (3019), H is changed to H+1 (3020), and it is determined whether H is greater than the number of motor unit output reduction commands limit value I (3021). Thereafter, when H is less than or equal to I, steps 3017 to 3021 are repeated until C is equal to or less than D. If H is greater than I, the ECU power is blocked and an alarm is issued to the upper level controller (3022). As a result of step 3018, if C is less than or equal to D, E is measured (3023). It is determined whether the measured DC Link current measurement value E is greater than the DC link current limit value F (3024). When E is greater than F, a reduction command 3025 according to the DC Link (control unit) output reduction ratio J is issued for the DC link output, K is changed to K+1 (3026), and it is determined whether the number of DC Link (control unit) output reduction commands limit value K is greater than L (3027). Then, when K is L or less, steps 3023 to 3027 are repeated until E is equal to or less than F. If K is greater than L, the ECU power is blocked, and an alarm is issued to the upper level controller (3022). As a result of step 1024, when E is less than or equal to F, it is determined that the over current is blocked, H and K are initialized (3012), and a normal operation is performed. The task time performed from steps 3012 to 3022 may be performed to be less than or equal to M or less (3028).

As described above, by connecting the current detection element to a position that can measure an over current for the control unit, when an over current flows due to a load that is heavy compared to the capacity of the control unit, an over current can be detected and blocked early, thereby enabling to protect the internal circuit of the control unit. In addition, when an over current flows due to a fault such as a short circuit in the control unit by changing the path of GND, the over current can be detected and blocked early, thereby enabling to inhibit the breakdown of wiring inside the vehicle and other electronic devices.

Figure 23:
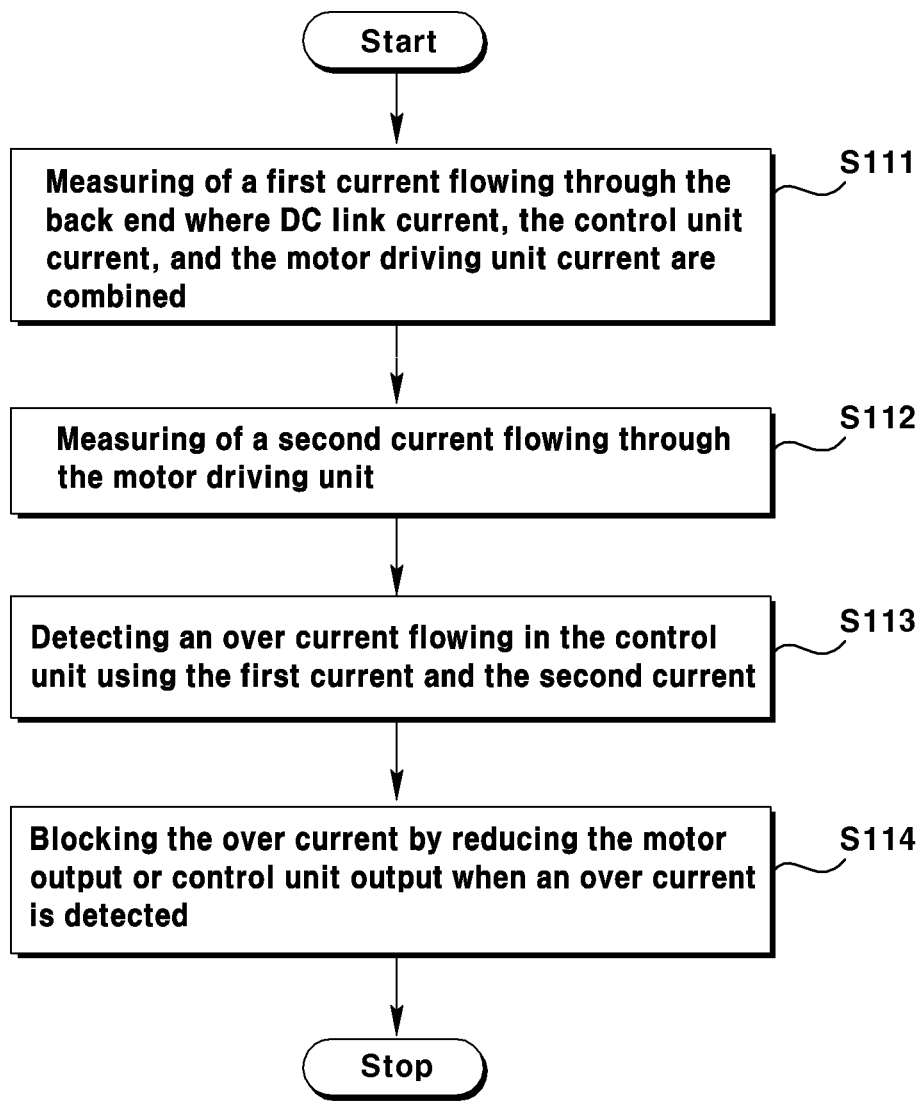
FIG. 23 is a flowchart of an over current detection method according to an embodiment of a second embodiment of the present invention.

FIG. 23 is a flowchart of an over current detection method according to an embodiment of a second embodiment of the present invention; and FIGS. 24 to 28 are flowcharts of an over current sensing method according to another embodiment of a second embodiment of the present invention. The detailed description of each step of FIGS. 23 to 28 corresponds to the detailed description of the over current detection circuit of FIGS. 12 to 22, and thus the overlapping descriptions will be omitted. Each step of FIGS. 23 to 28 may be performed by one or more processing units.

In order to detect an over current, a first current flowing through a back end of the terminal into which the DC link current, the control unit current, and the motor driving unit current are combined is measured in step S111, and a second current flowing through the motor driving unit is measured in step S112.

An over current flowing through the control unit is detected in step S113 by using the first current and the second current measured in steps S111 and S112.

When the over current is detected in step S113, the over current is blocked by reducing the motor output or reducing the control unit output.

When the first current is greater than a first threshold value and the second current is greater than a second threshold value, the step of blocking the over current is can reduce the motor output until the second current becomes less than or equal to the second threshold value by controlling the motor driving unit, and in addition, when the first current is greater than a first threshold value and the second current is less than or equal to a second threshold value, the step of blocking the over current may reduce the output of the control unit until the third current obtained by subtracting the second current from the first current becomes less than or equal to a third threshold value.

Figure 24:
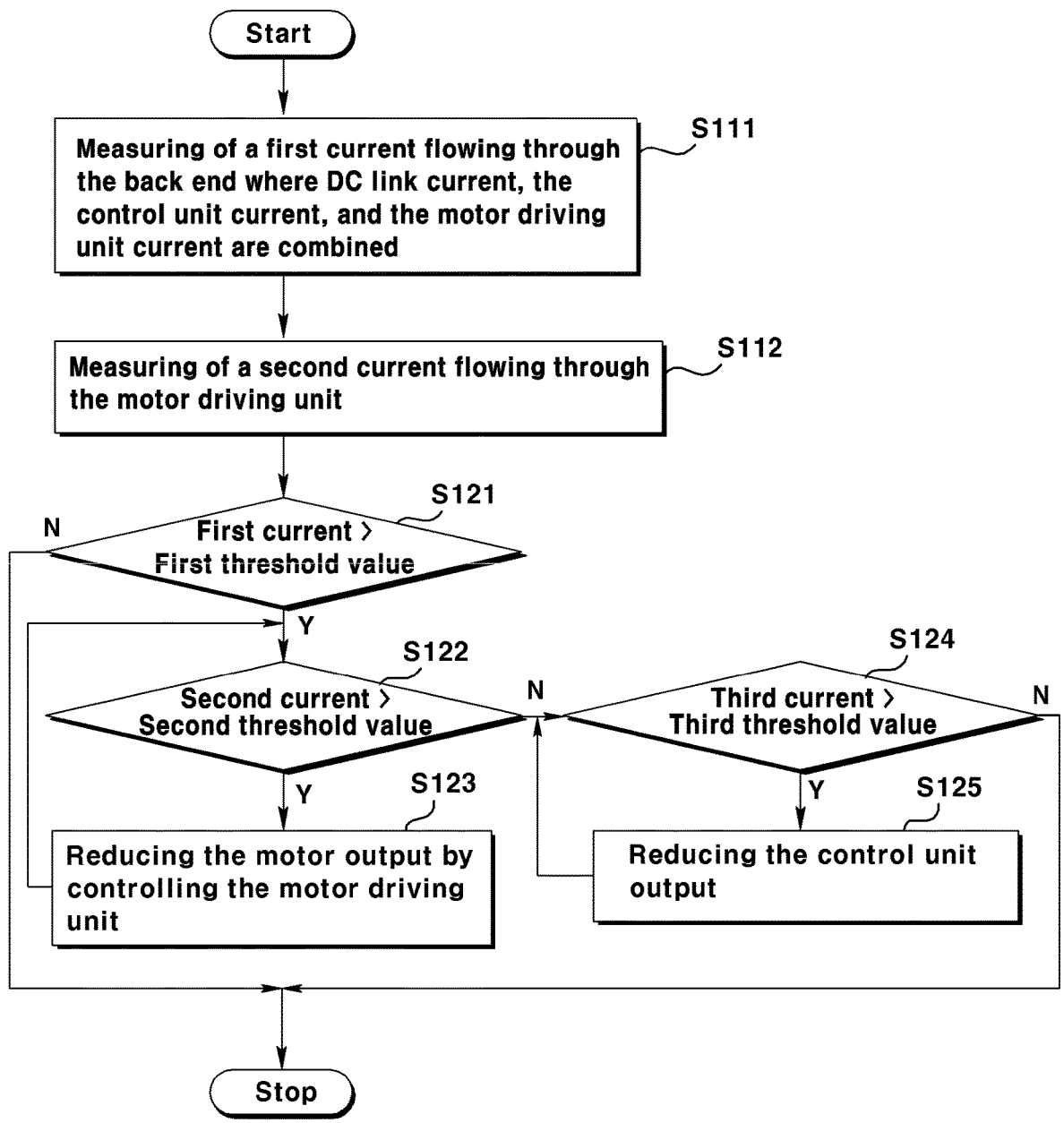
FIGS. 24 to 28 are flowcharts of an over current sensing method according to another embodiment of a second embodiment of the present invention.

After measuring the first current and the second current, as shown in FIG. 24, it is determined whether the first current is greater than the first threshold value in step S121, and when the first current is greater than the first threshold value, the second current is greater than the first threshold value, in step S122, it is determined whether the second current is greater than a second threshold value. When the second current is greater than the second threshold value, motor output is reduced to block the over current by controlling the motor driving unit. When the second current becomes less than the second threshold value by reducing the motor output, it is determined whether the third current by summing the first current and the second current in step S124 is greater than a third threshold value, and when the third current is greater than the third threshold value, the output of the control unit may be reduced in step S125. When the third current becomes less than or equal to the third threshold value by reducing the output of the control unit, it operates normally.

In addition, when the number of times of reducing the motor output is greater than or equal to a predetermined number of times or the second current does not become less than or equal to the second threshold value within a predetermined time, the power being inputted to the ECU can be blocked; and when the number of times of reducing the output of the control unit is greater than or equal to a predetermined number of times or the third current does not become equal to or less than the third threshold value within a predetermined time, the power being inputted to the ECU can be blocked.

Figure 25:
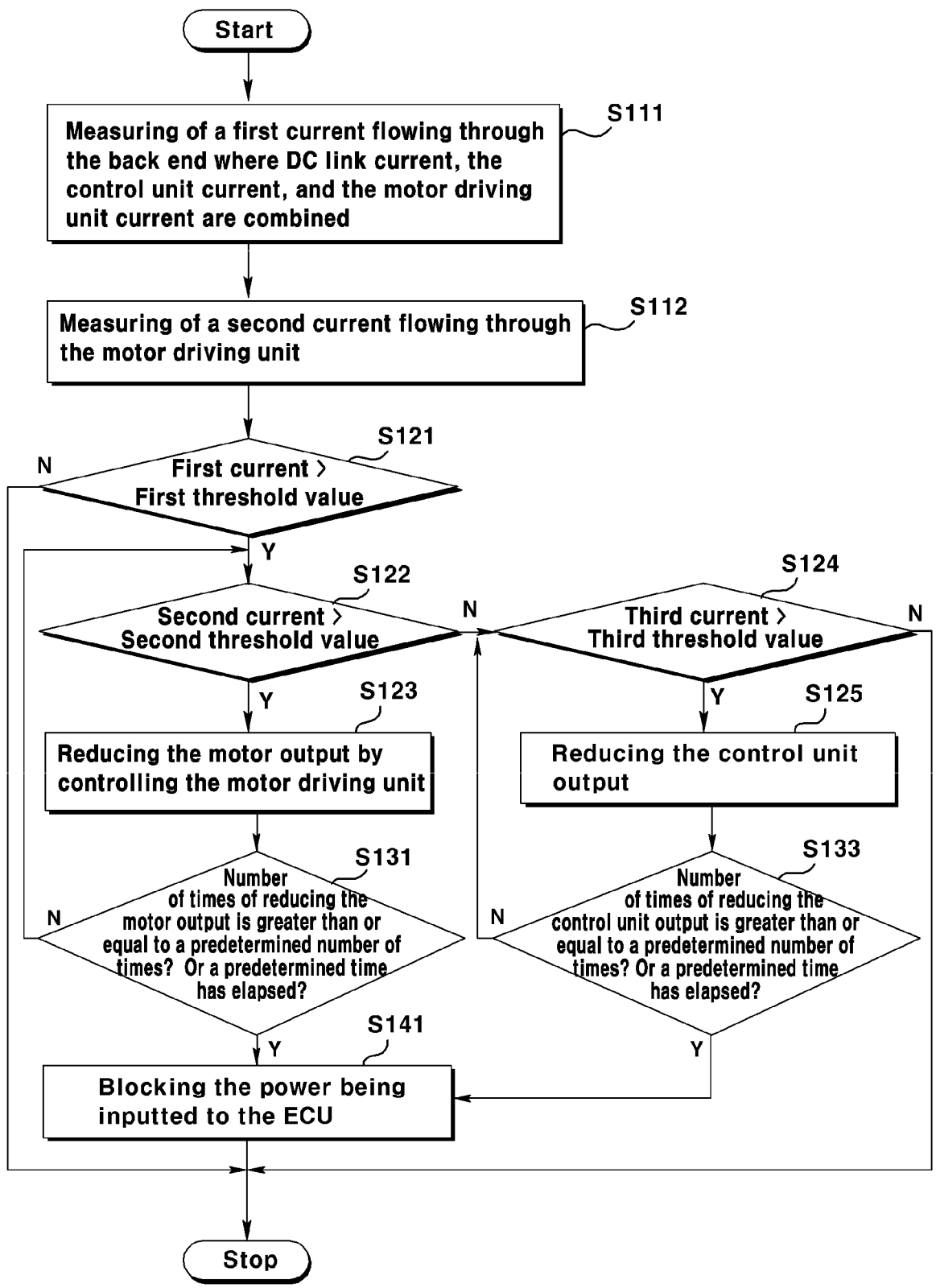
Figure 26:
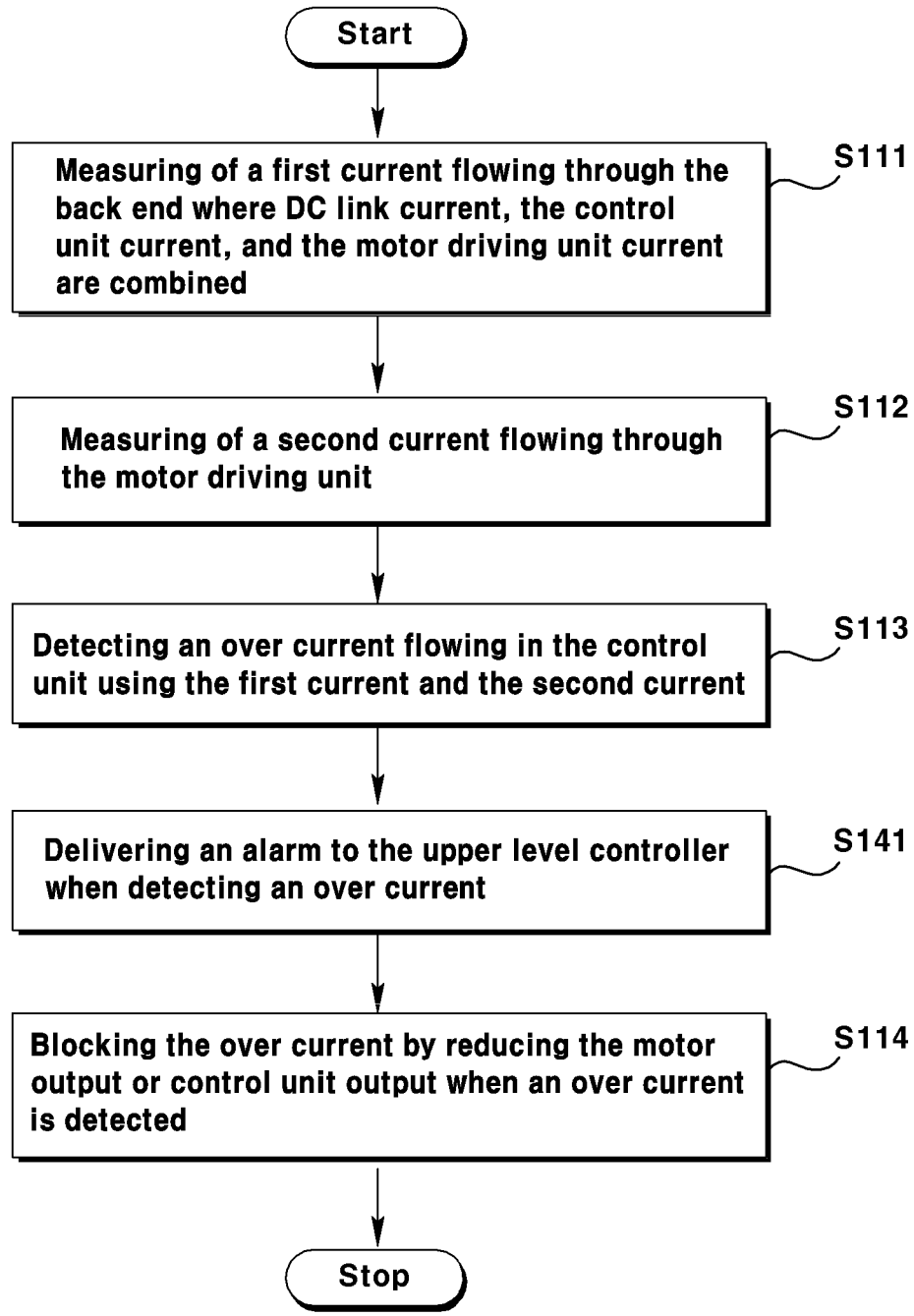

In reducing motor output or control unit output, when it is determined that it is difficult to block over current, the power being inputted to the ECU including the DC link, control unit, and motor driving unit can be blocked. As shown in FIG. 25, in step S123, the motor output is reduced by controlling the motor driving unit; in step S131, it is determined whether the number of times of reducing the motor output is greater than or equal to a predetermined number of times or a predetermined time has elapsed; when the number of times of reducing the motor output is greater than or equal to a predetermined number of times or a predetermined time has not elapsed, steps S122 to S123 are repeated; and when the number of times of reducing the motor output is greater than or equal to a predetermined number of times or a predetermined time has elapsed, the power being inputted to the ECU may be blocked. The power being inputted to the ECU can be blocked and an alarm can be issued to the upper level controller. At this time, the order of steps S123 and S131 may be interchanged. That is, it may be determined whether the number of times the motor output is reduced is greater than or equal to a predetermined number of times or a predetermined time has elapsed before the reduction of the motor output.

In addition, in step S125, the output of the control unit is reduced; in step S133, it is determined whether the number of times the control unit output is reduced is more than a predetermined number of times or a predetermined time has elapsed; if the number of times of reducing the control unit output is greater than or equal to a predetermined number of times or a predetermined time has not elapsed, steps S124 to S125 are repeated, When the number of times the control unit output is reduced is more than a predetermined number of times or a predetermined time has elapsed, the power being inputted to the ECU can be blocked. The power being inputted to the ECU can be blocked and an alarm can be issued to the upper level controller. At this time, the order of steps S125 and S133 may be interchanged. That is, it can be determined whether the number of times the control unit output is reduced is equal to or greater than a predetermined number of times or a predetermined time has elapsed before the control unit output is reduced.

When detecting an over current flowing in the control unit in step S113, an alarm may be delivered to the upper level controller in step S141.

Figure 27:
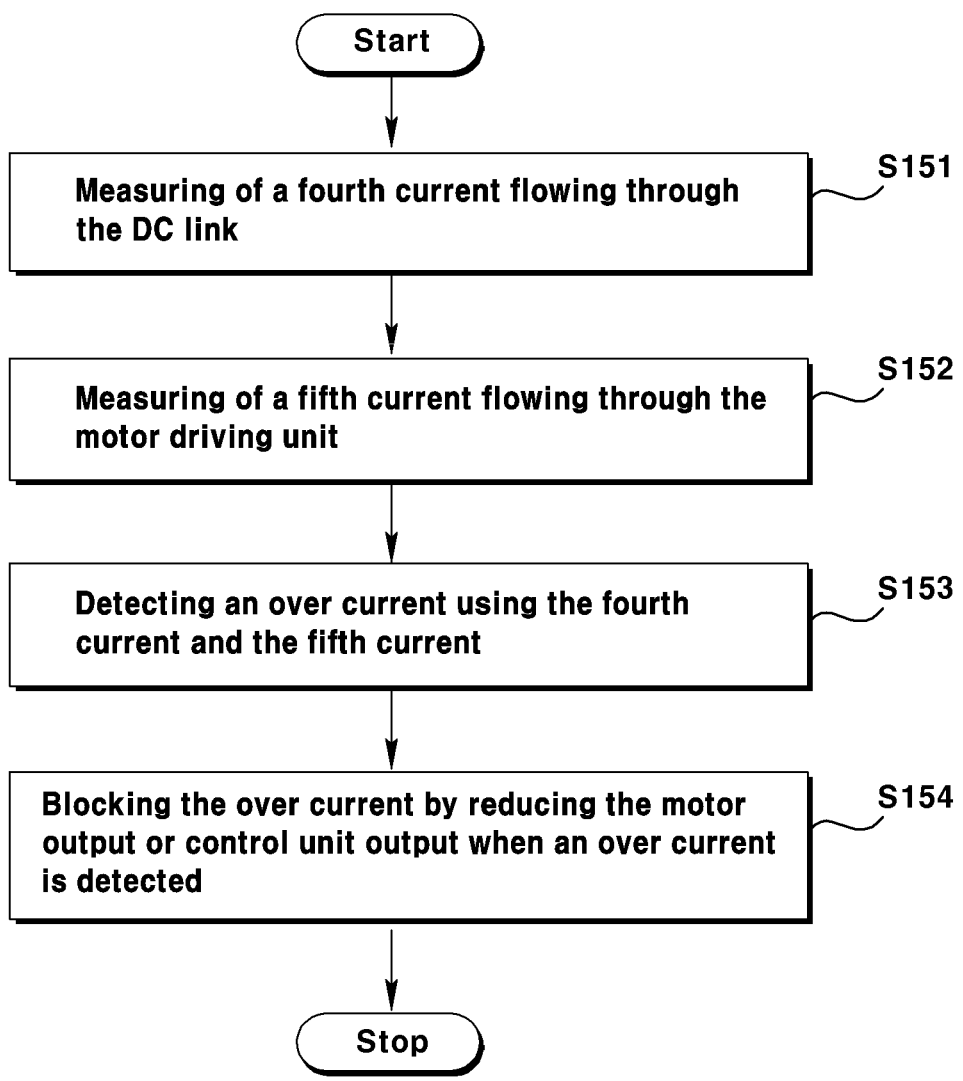

FIG. 27 is a flowchart of an over current sensing method according to another embodiment of a second embodiment of the present invention, it is corresponding to a method of detecting an over current in the over current detection circuit of FIG. 19.

In step S151, a fourth current flowing in the DC link is measured; in step S152, a fifth current flowing through the motor driving unit is measured; in step S153, an over current is sensed using the fourth current and the fifth current. When the over current is detected in step S153, the over current is blocked by reducing the motor output or reducing the control unit output in step S154. The output of the control unit or DC link output may be reduced in step S154.

A sixth current that is the sum of the fourth current and the fifth current is greater than a fourth threshold value, and when the fifth current is greater than the fifth threshold value, the motor output is reduced by controlling the motor driving unit until the fifth current becomes less than or equal to the fifth threshold value; when the number of times of reducing the motor output is more than a predetermined number of times, or the fifth current does not fall below the fifth threshold value within a predetermined time, the power being inputted to the ECU can be blocked; when a sixth current that is the sum of the fourth current and the fifth current is greater than a fourth threshold value, and the fifth current is less than or equal to a fifth threshold value, the output of the control unit is reduced until the fourth current becomes less than or equal to the sixth threshold value; and when the number of times of reducing the output of the control unit is more than a predetermined number of times, or the fourth current does not fall below the sixth threshold value within a predetermined time, the power being inputted to the ECU can be blocked.

Figure 28:
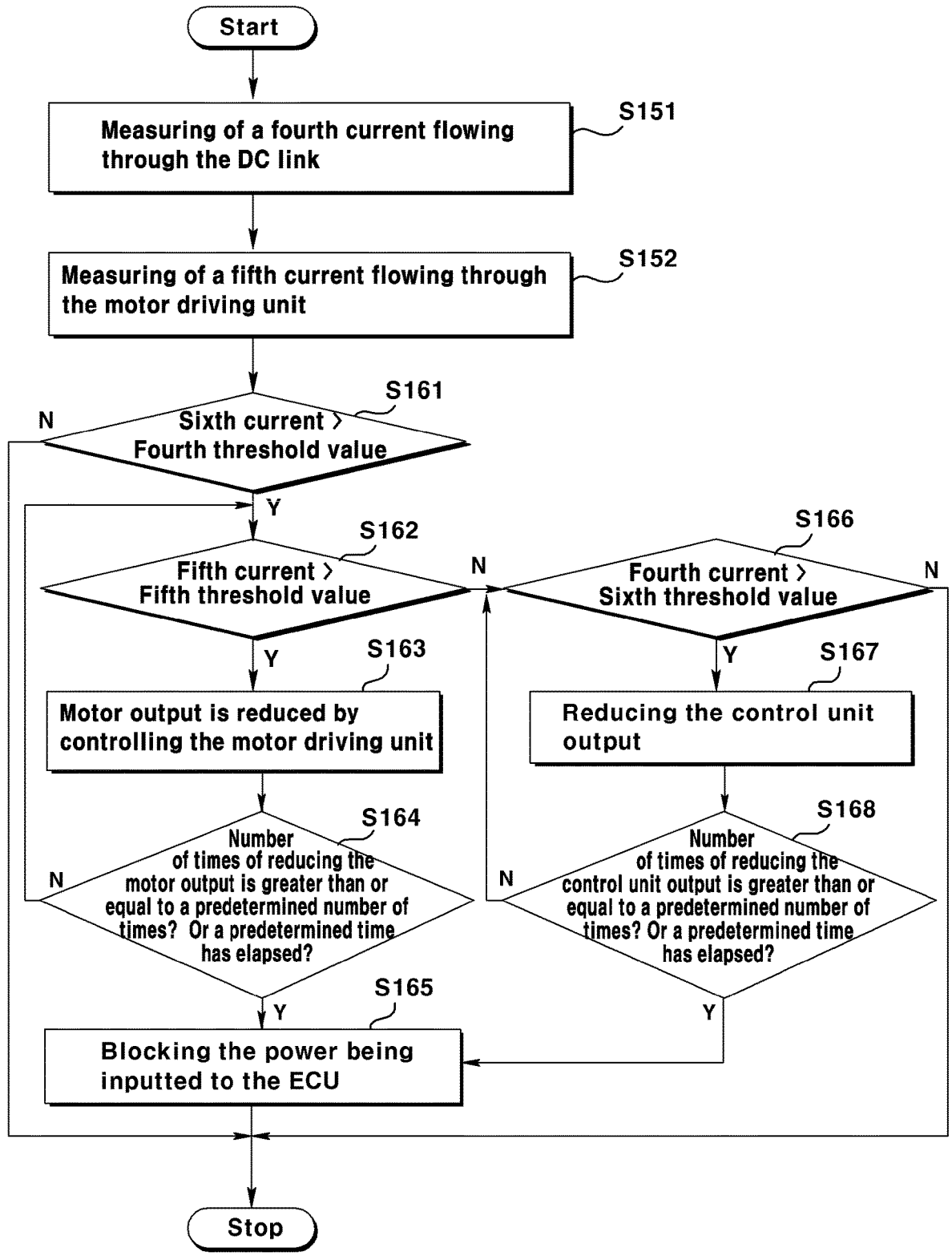

A specific process of detecting and blocking the over current may be performed as shown in FIG. 28. After measuring the fourth current and the fifth current, it is determined whether a sixth current obtained by adding the fourth current and the fifth current is greater than a fourth threshold value in step S161. When the sixth current is less than or equal to the fourth threshold value, it operates normally. If the sixth current is greater than the fourth threshold value, it is determined whether the fifth current is greater than the fifth threshold value in step S162. When the fifth current is greater than the fifth threshold value, the motor output may be reduced by controlling the motor driving unit in step S163. In step S164, it is determined whether the number of times of reducing the motor output is greater than or equal to a predetermined number of times or a predetermined time has elapsed; and if the number of times the motor output is reduced is more than a predetermined number of times or the predetermined time has not elapsed, steps S162 to S163 are repeated. When the number of times of reducing the motor output is more than a predetermined number of times or a predetermined time has elapsed, the power being inputted to the ECU may be blocked. The order of steps S163 and S164 may be interchanged. As a result of the determination in step S162, if the fifth current is less than or equal to the fifth threshold value, it is determined whether the fourth current is greater than the sixth threshold value in step S166. When the fourth current is less than or equal to the sixth threshold value, it is determined that the over current is blocked, and the over current blocking process is terminated and a normal operation is performed. When the fourth current is greater than the sixth threshold value, the output of the control unit may be reduced in step S167. It is also possible to reduce the output of the DC link other than the control unit. In step S168, it is determined whether the number of times of reducing the control unit output (or DC link output) is more than a predetermined number of times or a predetermined time has elapsed; and when the number of times the control unit output (or DC link output) is reduced is more than a predetermined number of times or a predetermined time has not elapsed, steps S166 to S167 are repeated. When the number of times the control unit output (or DC link output) is reduced is more than a predetermined number of times or a predetermined time has elapsed, the power being inputted to the ECU may be blocked.

A modified embodiment according to the present embodiment may include some configurations of a first embodiment and some configurations of a second embodiment together. That is, the modified embodiment may include the first embodiment, but some configurations of the first embodiment may be omitted and may include some configurations of the corresponding second embodiment. Or, a modified embodiment may include a second embodiment, but some components of the second embodiment are omitted, and may include some components of the corresponding first embodiment.

Features, structures, effects, and the like described in the above embodiments are included in at least one embodiment, and are not necessarily limited to only one embodiment. Furthermore, features, structures, effects, and the like illustrated in each embodiment can be combined or modified for other embodiments by those of ordinary skill in the art to which the embodiments belong. Accordingly, the contents related to such combinations and variations should be interpreted as being included in the scope of the embodiments.

Meanwhile, the embodiments of the present invention can be implemented as computer-readable codes on a computer-readable recording medium. The computer-readable recording medium includes all types of recording devices in which data readable by a computer system is stored.

As examples of computer-readable recording media there are ROM, RAM, CD-ROM, magnetic tape, floppy disk, and optical data storage devices, and in addition, they are distributed across networked computer systems in a distributed manner in which computer-readable code can be stored and executed. And functional programs, codes, and code segments for implementing the present invention can be easily inferred by programmers in the technical field to which the present invention belongs.

As described above, in the present invention, specific matters such as specific components, and the like; and limited embodiments and drawings have been described, but these are only provided to help a more general understanding of the present invention, and the present invention is not limited to the above embodiments, and various modifications and variations are possible from these descriptions by those of ordinary skill in the art to which the present invention belongs.

Therefore, the spirit of the present invention should not be limited to the described embodiments, and not only the claims to be described later, but also all those with equivalent or equivalent modifications to the claims will be said to belong to the scope of the spirit of the present invention.

The invention claimed is:

1. A device for measuring current of 3-phase inverter comprising:
   a current detection element connected to a lower end of one of three lower switches configuring an inverter;
   a current measurement unit configured to measure a current by using the current detection element and the other two of the lower switches, to which the current detection element is not connected; and a current correction unit configured to correct a second current value and a third current value on the basis of relationship between a first current value measured using the current detection element and the second current value and the third current value measured using the two lower switches.

2. The device for measuring current of 3-phase inverter according to claim 1,
wherein the current detection element comprises a shunt resistor.

3. The device for measuring current of 3-phase inverter according to claim 2,
wherein the current measurement unit measures the first current value by detecting a voltage drop component of the shunt resistor.

4. The device for measuring current of 3-phase inverter according to claim 1,
wherein the current measurement unit measures the second current value and the third current value by detecting a voltage drop component of each of the two lower switches.

5. The device for measuring current of 3-phase inverter according to claim 1,
wherein the lower switch is composed of an FET.

6. The device for measuring current of 3-phase inverter according to claim 1,
wherein the current measurement unit measures the second current value or the third current value by measuring a voltage drop caused by a resistance value between both ends of a drain and a source when the lower switch is turned on.

7. The device for measuring current of 3-phase inverter according to claim 1,
wherein the current measurement unit measures the second current value and the third current value by using each Rdson of the two lower switches.

8. The device for measuring current of 3-phase inverter according to claim 1,
wherein the current correction unit determines whether peak value of the second current value or the third current value is same as the first current value, and
when the peak value of the second current value or the third current value is different from the first current value, the current correction unit adjusts a scale of the second current value or the third current value having a different peak value from the first current value.

9. The device for measuring current of 3-phase inverter according to claim 1, comprising:
a current control unit configured to use the adjusted current value as a control signal of the inverter.

10. A current measuring method of 3-phase inverter comprising the steps of:
measuring a first current value using a current detection element connected to a lower end of one of a lower switch of three lower switches configuring an inverter;
measuring a second current value and a third current value using the other two lower switches to which the current detection element is not connected; and
correcting the second current value and the third current value on the basis of relationship between the first current value, the second current value, and the third current value.

11. The current measuring method of 3-phase inverter according to claim 10,
wherein the current detection element comprises a shunt resistor.

12. The current measuring method of 3-phase inverter according to claim 11,
wherein, in the step of measuring of the first current value, the first current value is measured by detecting a voltage drop component of the shunt resistor.

13. The current measuring method of 3-phase inverter according to claim 10,
wherein, in the step of measuring the second current value and the third current value, the second current value and the third current value are measured by detecting a voltage drop component of each of the two lower switches.

14. The current measuring method of 3-phase inverter according to claim 10,
wherein the step of correcting the second current value and the third current value may include the steps of:
determining whether peak value of the first current value and the second current value or the third current value is same; and
adjusting a scale of the second current value or the third current value having a different peak value from the first current value, when the peak value of second current value or the third current value is different from the first current value.

15. The current measuring method of 3-phase inverter according to claim 10,
wherein, in the step of measuring the second current value and the third current value, the second current value or the third current value is measured by measuring a voltage drop caused by a resistance value between both ends of a drain and a source when the lower switch is turned on.

16. The current measuring method of 3-phase inverter according to claim 10,
wherein, in the step of measuring the second current value and the third current value, the second current value or the third current value is measured by using each Rdson of the two lower switches.

17. The current measuring method of 3-phase inverter according to claim 10 comprising the steps of,
using the adjusted current value as a control signal of the inverter.

18. A device for measuring current of 3-phase inverter comprising:
three upper switches connected in parallel;
three lower switches respectively connected to the three upper switches;
a shunt resistor connected to a lower switch lower end of one of the three lower switches;
a current measurement unit configured to measure a first current value in the shunt resistor, and a second current value and a third current value in the two lower switches to which the shunt resistor is not connected; and
a current correction unit configured to correct the second current value or the third current value based on the first current value.

19. The device for measuring current of 3-phase inverter according to claim 18,
wherein the current measurement unit measures the first current value by detecting a voltage drop component of the shunt resistor.

20. The device for measuring current of 3-phase inverter according to claim 18,
wherein the current correction unit determines whether peak value of the second current value or the third current value is same as the first current value, and when the peak value of the second current value or the third current value is different from the first current value, the current correction unit adjusts a scale of the second current value or the third current value having a different peak value from the first current value.

\* \* \* \* \*